United States Patent
Hidaka

(10) Patent No.: US 7,254,058 B2
(45) Date of Patent: Aug. 7, 2007

(54) THIN FILM MAGNETIC MEMORY DEVICE PROVIDED WITH PROGRAM ELEMENT

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 95 days.

(21) Appl. No.: 11/028,313

(22) Filed: Jan. 4, 2005

(65) Prior Publication Data

US 2005/0117393 A1 Jun. 2, 2005

Related U.S. Application Data

(62) Division of application No. 10/623,565, filed on Jul. 22, 2003, now Pat. No. 6,842,367.

(30) Foreign Application Priority Data

Feb. 14, 2003 (JP) ............................. 2003-037080

(51) Int. Cl.
   *G11C 11/14* (2006.01)
(52) U.S. Cl. .................... 365/171; 365/200; 365/225.7
(58) Field of Classification Search ................ 365/131, 365/158, 171 O, 173, 200 X, 225.7 X, 171, 365/200, 225.7

See application file for complete search history.

(56) References Cited

U.S. PATENT DOCUMENTS

| 6,671,213 B2 * | 12/2003 | Ohtani ...................... 365/200 |
| 6,683,807 B2 | 1/2004 | Hidaka |
| 6,751,149 B2 | 6/2004 | Seyyedy et al. |
| 6,778,432 B2 | 8/2004 | Ohtani |
| 6,917,540 B2 * | 7/2005 | Ooishi ........................ 365/173 |
| 2004/0057281 A1 | 3/2004 | Ooishi |

FOREIGN PATENT DOCUMENTS

JP 2002-117684 4/2002

OTHER PUBLICATIONS

Scheuerlein, et al. "A 10ns Read and Write Non-Volatile Memory Array Using a Magnetic Tunnel Junction and FET Switch in Each Cell" IEEE International Solid-State Circuits Conference (2000) TA 7.2.

Durlam, et al. "Nonvolatile RAM Based on Magnetic Tunnel Junction Elements" IEEE International Solid-State Circuits Conference (2000) TA 7.3.

Naji, et al. "A 256kb 3.0V 1T1MJT Nonvolatile Magnetoresistive RAM" IEEE International Solid-State Circuits Conference (2001) 7.6.

* cited by examiner

*Primary Examiner*—VanThu Nguyen
(74) *Attorney, Agent, or Firm*—McDermott Will & Emery LLP

(57) ABSTRACT

A program element has a magnetic layer electrically connected between first and second nodes. At least a portion of the magnetic layer forms a link portion designed to be blown with external laser irradiation. The magnetic layer is provided in the same layer as and with the same structure as a tunneling magneto-resistance element in an MTJ memory cell. An electrical contact between the magnetic layer and respective one of the first and second nodes has the same structure as the electrical contact between the tunneling magneto-resistance element and an interconnection provided in the same metal interconnection layer as respective one of the first and second nodes in the MTJ memory cell.

4 Claims, 15 Drawing Sheets

THIN FILM MAGNETIC MEMORY DEVICE PROVIDED WITH PROGRAM ELEMENT

This application is a divisional of application Ser. No. 10/623,565 filed Jul. 22, 2003 now U.S. Pat. No. 6,842,367.

BACKGROUND OF THE INVENTION

1. Field of the Invention

The present invention relates to thin film magnetic memory devices, and more particularly to a thin film magnetic memory device provided with a memory cell having a magnetic tunnel junction and a program element for storing information in a fixed manner.

2. Description of the Background Art

A magnetic random access memory device (MRAM device) has attracted attention as a memory device capable of non-volatile data storage with low power consumption. The MRAM device stores data in a non-volatile manner using a plurality of thin film magnetic elements formed on a semiconductor integrated circuit, and permits random access to the respective thin film magnetic element.

In particular, it has been reported that provision of memory cells (hereinafter, also referred to as "MTJ memory cells") formed of thin film magnetic elements utilizing magnetic tunnel junctions (MTJ) significantly improves the performance of the MRAM device. The MTJ memory cell stores data as it is magnetized, by a magnetic field generated by a data write current, in a direction corresponding to data to be written. Such an MRAM device is disclosed, e.g., in "A 10 ns Read and Write Non-Volatile Memory Array Using a Magnetic Tunnel Junction and FET Switch in each Cell", 2000 IEEE ISSCC Digest of Technical Papers, TA7.2.

A memory device is generally provided with a program element, such as a fuse element, for the purposes of fixedly storing information necessary for redundancy repair, tuning information of an internal voltage and others. In the MRAM device capable of storing data in each memory cell in a non-volatile manner, it is possible to use an excessive MTJ memory cell to constitute such a program element.

Alternatively, Japanese Patent Laying-Open No. 2002-117684 discloses, focusing on an insulating film forming a magnetic tunnel junction, a configuration for programming information in a fixed manner by causing breakdown of the insulating film.

In the case of forming the program element with an excessive MTJ memory cell, however, data stored in the MTJ memory cell may be lost during heat treatment after completion of a wafer process, through burn-in and packaging steps, before shipment.

As a program element permitting more stable storage of information, a fuse element which can be blown with laser irradiation in a wafer state is known. The MRAM device, compared to a normal memory device, requires additional depositing and processing steps dedicated to formation of the MTJ memory cells. Thus, the number of other steps should be made as small as possible. As such, it is desirable that formation of such a fuse element does not require dedicated manufacturing steps.

Furthermore, the memory device is tested in each of wafer state, packaged state, and others. As such, there is a demand for a program element which can program information accumulatively based on results of the plurality of tests.

SUMMARY OF THE INVENTION

An object of the present invention is to provide a program element which can be fabricated in parallel with an MTJ memory cell in a manufacturing step of the MTJ memory cell, without a need of a dedicated manufacturing step, and a thin film magnetic memory device provided with a program circuit which can program information accumulatively over a plurality of steps using the relevant program element.

A thin film magnetic memory device according to the present invention includes a plurality of magnetic memory cells permitting random accesses, and a program element storing information in a fixed manner. Each of the magnetic memory cells includes a conductive magnetic film formed of a plurality of layers. The program element includes a link portion which is electrically connected between first and second nodes and fusible by an external input. The link portion is formed of the same layer as at least one of the plurality of layers constituting the conductive magnetic film.

Accordingly, a main advantage of the present invention is that, in the thin film magnetic memory device, the program element formed as a fuse element utilizing the same structural portion as at least a portion of the conductive magnetic film constituting the magnetic memory cell (MTJ memory cell) can be manufactured in parallel with the magnetic memory cells in a manufacturing step of the magnetic memory cells without provision of a manufacturing step dedicated to the program element. As a result, a stable program element can be built in the thin film magnetic memory device, without an increase of the number of manufacturing steps or the manufacturing cost.

A thin film magnetic memory device according to another configuration of the present invention includes a plurality of magnetic memory cells permitting random accesses, and a program circuit storing information in a fixed manner. Each of the magnetic memory cells includes a tunneling magneto-resistance element which is formed of a plurality of layers including a conductive magnetic film and an insulating film and of which resistance changes in accordance with magnetically written data. The program circuit includes a first program element connected between first and second nodes and formed of the plurality of layers as with the tunneling magneto-resistance element, an amplifier portion reading the information in accordance with a resistance between the first and second nodes, and a first breakdown voltage apply portion applying a first voltage stress capable of causing breakdown of the insulating film in the plurality of layers constituting the first program element between the first and second nodes as appropriate. An upper layer side and a lower layer side of the plurality of layers constituting the first program element are electrically connected to one and the other of the first and second nodes. The first program element is shaped such that at least a portion of the portion electrically connected between the first and second nodes is fusible with a first external input.

With such a thin film magnetic memory device, the program circuit using the program element which can be fabricated without increasing the number of manufacturing steps is capable of programming information before and after a packaging step independently from each other. That is, after information based on the operation test result in a wafer state, following completion of a wafer process, is programmed by laser irradiation, information obtained after the relevant step can be programmed by an external voltage input accompanied by breakdown. As a result, defects detected, e.g., in a wafer test, a test after burn-in and a test after packaging, can be programmed accumulatively for repair.

A thin film magnetic memory device according to yet another configuration of the present invention includes a plurality of magnetic memory cells permitting random accesses, and a program circuit storing information in a fixed manner. Each of the plurality of magnetic memory cells includes a tunneling magneto-resistance element formed of a plurality of layers including a conductive magnetic film and an insulating film and having a resistance changed in accordance with magnetically written data. The program circuit includes a first program element formed of the plurality of layers as with the tunneling magneto-resistance element, a first program interconnection electrically connected to the first program element and a first node, a first current driving portion for supplying the first program interconnection with a current for magnetically writing data to the first program element, and an amplifier portion reading the information in accordance with a resistance between the first and second nodes. An upper layer side and a lower layer side of the plurality of layers constituting the first program element are electrically connected to one and the other of the first program interconnection and the second node. The first program interconnection is shaped such that at least a portion of its portion electrically connected between the first program element and the first node is fusible by a first external input.

With such a thin film magnetic memory device, the program circuit using the program element which can be fabricated without increasing the number of manufacturing steps is capable of programming information before and after blowing with laser irradiation independently from each other. Thus, after information based on an operation test result in a wafer test is programmed by magnetic writing, a test as to whether a desired operation is performed by the relevant information program can be carried out without actual laser blowing. Further, the confirmed program information can be stored stably with laser blowing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in detail with reference to the drawings.

First Embodiment

Figure 1:
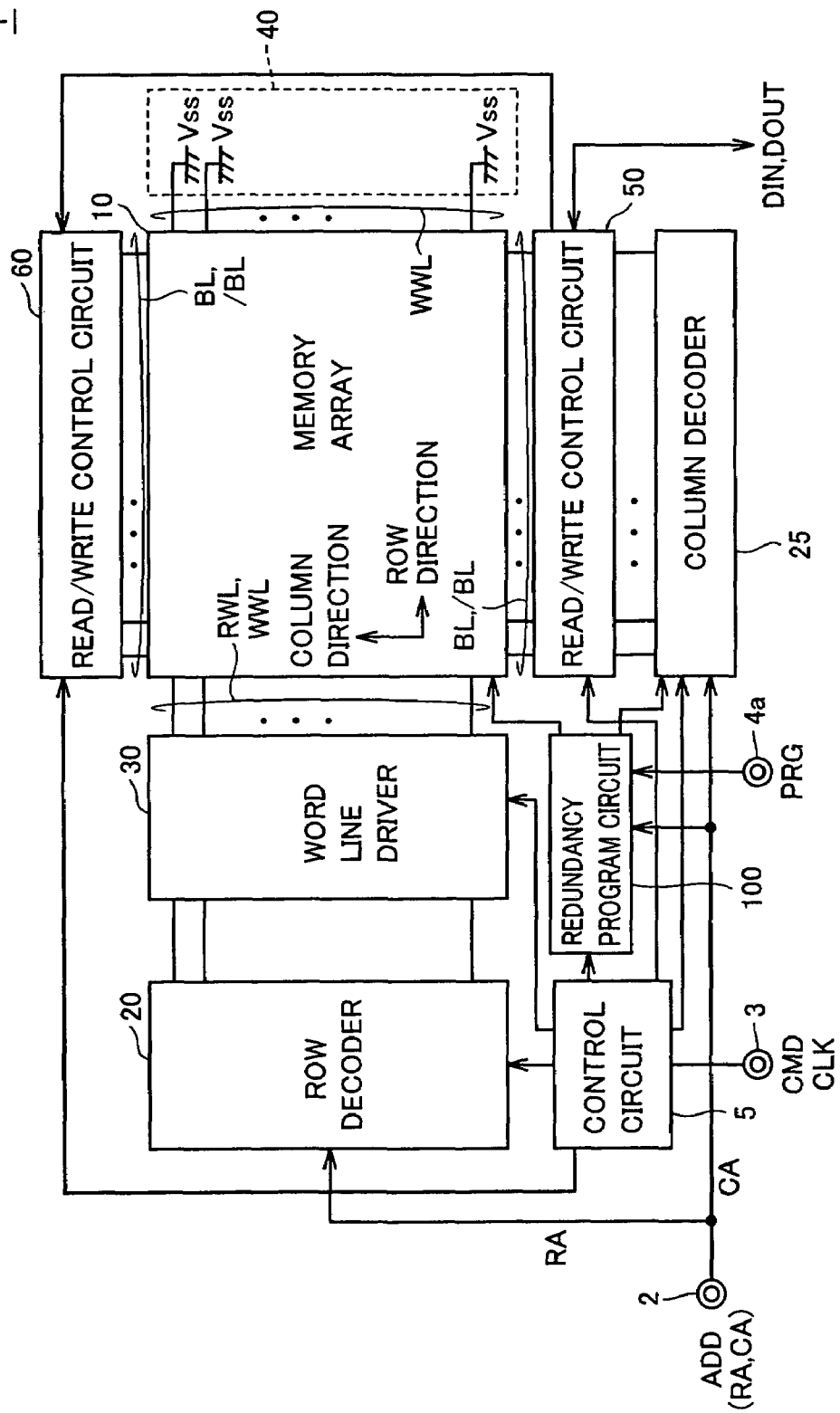
FIG. 1 is a schematic block diagram showing an entire configuration of an MRAM device according to a first embodiment of the present invention.

Referring to FIG. 1, the MRAM device 1 according to the first embodiment of the present invention performs random access in accordance with externally supplied control signal CMD and address signal ADD, and performs input of write data DIN and output of read data DOUT. The data read operation and the data write operation in MRAM device 1 are performed at timings in synchronization with an externally applied dock signal CLK, for example. Alternatively, the operating timings may be determined within the device, unprovided with external dock signal CLK.

MRAM device 1 includes: an address terminal 2 receiving input of address signal ADD; a control signal terminal 3 receiving input of control signal CMD and clock signal CLK; a signal terminal 4a receiving input of a control signal PRG that is activated in a program operation; a control circuit 5 for controlling the entire operations of MRAM device 1 in response to control signal CMD and clock signal CLK; and a memory array 10 having a plurality of MTJ memory cells arranged in rows and columns.

Memory array 10, whose configuration will be described later in detail, includes: a plurality of normal MTJ memory cells (hereinafter, also simply referred to as the "normal memory cells") arranged in rows and columns, each of which cells can be accessed at random in accordance with address signal ADD; and spare memory cells (not shown) for repairing the normal memory cell suffering a defect (hereinafter, also referred to as the "defective memory cell").

Repair of a defective normal memory cell is performed by replacement in a unit of prescribed redundancy repair section. The spare memory cells constitute a plurality of redundant circuits (not shown) each for replacement of a redundancy repair section including a defective memory cell. Generally, the unit of redundancy repair section is a memory cell row, a memory cell column, or a data I/O line, in which cases, the redundant circuits each correspond to a spare row, a spare column, or a spare block corresponding to a spare I/O line, respectively. In the present embodiment, it is assumed that repair of a defective normal memory cell is performed in a unit of memory cell column, as will be described later in detail.

A plurality of write word lines WWL and read word lines RWL are arranged corresponding to the respective MTJ memory cell rows (hereinafter, also simply referred to as the "memory cell rows"). Bit lines BL and /BL are arranged corresponding to the respective MTJ memory cell columns (hereinafter, also simply referred to as the "memory cell columns").

MRAM device 1 further includes a row decoder 20, a column decoder 25, a word line driver 30, and read/write control circuits 50, 60.

Row decoder 20 performs row selection in memory array 10 in accordance with a row address RA indicated by address signal ADD. Column decoder 25 performs column selection in memory array 10 in accordance with a column address CA indicated by address signal ADD. Word line driver 30 selectively activates read word line RWL or write word line WWL based on the row selection result of row decoder 20. Row address RA and column address CA indicate a memory cell that is selected as a target of data read or data write (hereinafter, also referred to as the "selected memory cell").

Write word line WWL is coupled to a prescribed voltage (typically, a ground voltage) Vss in a region 40 on the other side of memory array 10 from a region where word line driver 30 is arranged. Read/write control circuits 50, 60 collectively represent circuit groups arranged adjacent memory array 10 for causing a data write current and a sense current (data read current) to pass through bit lines BL and /BL of a memory cell column corresponding to the selected memory cell (hereinafter, also referred to as the "selected column").

MRAM device 1 further includes a redundancy program circuit 100. Redundancy program circuit 100 includes a program element which can be blown with external laser irradiation. The program element is used to fixedly store a defective address corresponding to the column address indicating the memory cell column (hereinafter, also referred to as the "defective column") in which a defective memory cell exists. As will be described later in detail, the program element according to the present embodiment can be fabricated in parallel with the MTJ memory cells in the step of forming the MTJ memory cells, without a need of dedicated manufacturing step.

Further, in a normal operation, redundancy program circuit 100 compares column address CA with the stored defective address, to judge whether a defective column has been selected as a target of data read or data write.

In the case where a defective column has been selected by column address CA, redundancy program circuit 100 designates an access to a redundant circuit formed of spare memory cells, and also instructs column decoder 25 to stop the access to the memory cell column indicated by column address CA. Consequently, data read or data write is performed with respect to the redundant circuit, instead of the memory cell column indicated by column address CA.

In the case where column address CA does not correspond to a defective address, column decoder 25 performs a normal column select operation. Specifically, it selects the memory cell column indicated by column address CA to perform data read or data write.

A redundant configuration in MRAM device 1 is now described.

Figure 2:
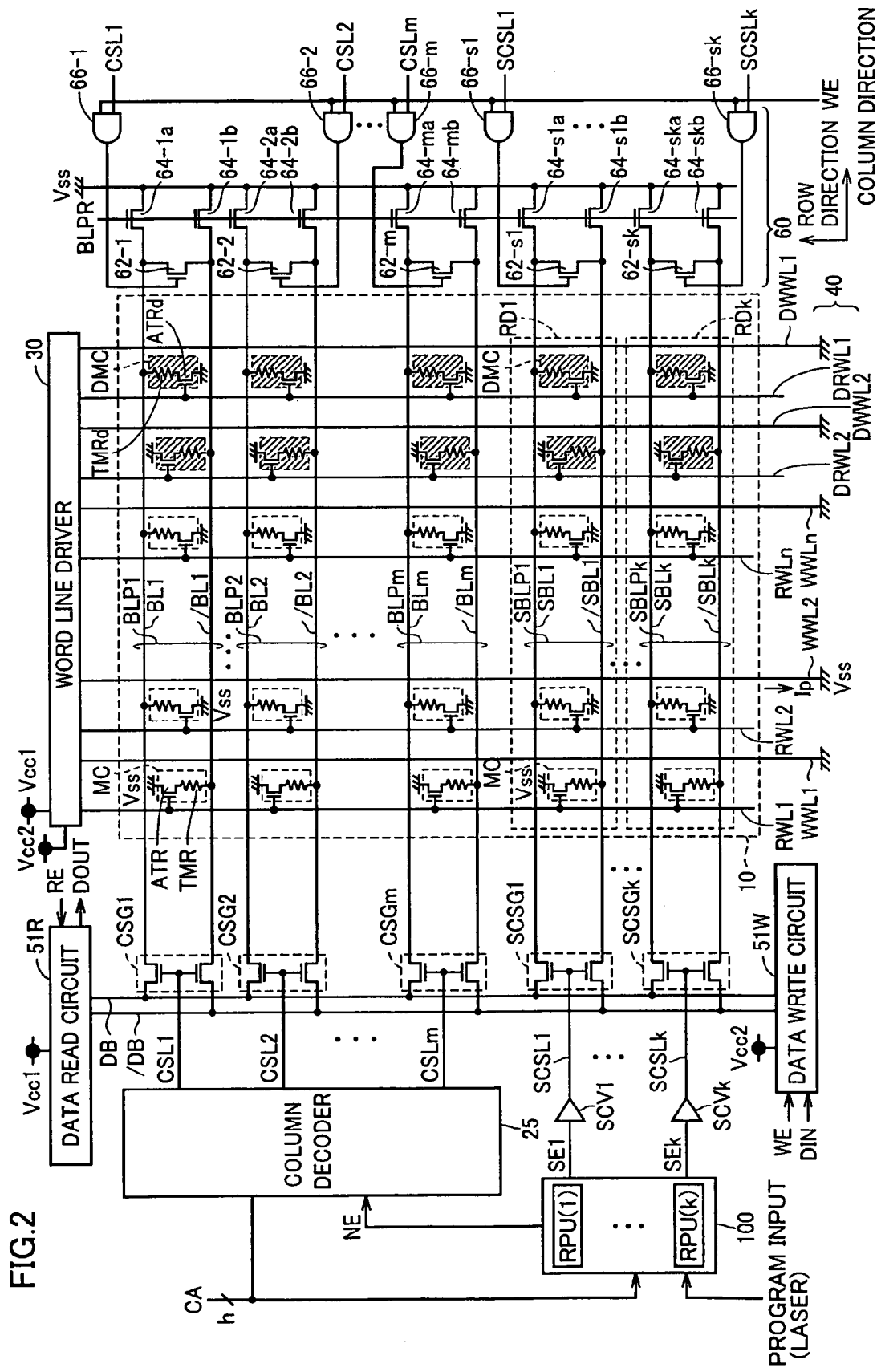
FIG. 2 is a circuit diagram showing a configuration of the memory array shown in FIG. 1.

Referring to FIG. 2, memory array 10 includes normal memory cells MC arranged in n rows and m columns (n and m are natural numbers), and k redundant circuits RD1-RDk (k is a natural number). In the present embodiment, the replacement/repair is performed in a unit of memory cell column. Thus, each of redundant circuits RD1-RDk corresponds to a spare column. Hereinafter, redundant circuits RD1-RDk are also collectively referred to as redundant circuit RD.

When viewed as a whole, memory array 10 has the MTJ memory cells of the identical configurations arranged in n memory cell rows and (m+k) memory cell columns.

Hereinafter, the memory cell columns formed of normal memory cells are also referred to as the "normal memory cell columns", and the memory cell columns formed of spare memory cells corresponding to respective redundant circuits RD1-RDk are also referred to as the "spare columns".

Read word lines RWL1-RWLn and write word lines WWL1-WWLn are arranged corresponding to respective memory cell columns. Bit line pairs BLP1-BLPm are arranged corresponding to respective normal memory cell columns. Each bit line pair is formed of complementary bit lines. For example, bit line pair BLP1 is formed of bit lines BL1 and /BL1.

Spare bit line pairs SBLP1-SBLPk are arranged corresponding to respective spare memory cell columns. Each spare bit line pair is formed of complementary bit lines, as with the bit line pair. For example, spare bit line pair SBLP1 is formed of spare bit lines SBL1 and /SBL1.

Hereinafter, write word lines, read word lines, bit line pairs, bit lines, spare bit line pairs and spare bit lines will be collectively represented as WWL, RWL, BLP, BL (/BL), SBLP and SBL (/SBL), respectively. Specific write word line, read word line, bit line pair, bit line, spare bit line pair and spare bit line will be represented as, e.g., WWL1, RWL1, BLP1, BL1 (/BL1), SBLP1 and SBL1 (/SBL1), with accompanying numerals.

The high voltage state (power supply voltages Vcc1, Vcc2) and low voltage state (ground voltage Vss) of data, signals and signal lines will also be referred to as an "H level" and an "L level", respectively.

The MTJ memory cells, i.e., normal memory cells MC and spare memory cells SMC, each have a tunneling magneto-resistance element TMR having its resistance changed in accordance with a level of stored data, and an access transistor ATR serving as an access gate, connected in series.

Now, the configuration and data storage principle of the MTJ memory cell are described with reference to FIG. 3.

Figure 3:
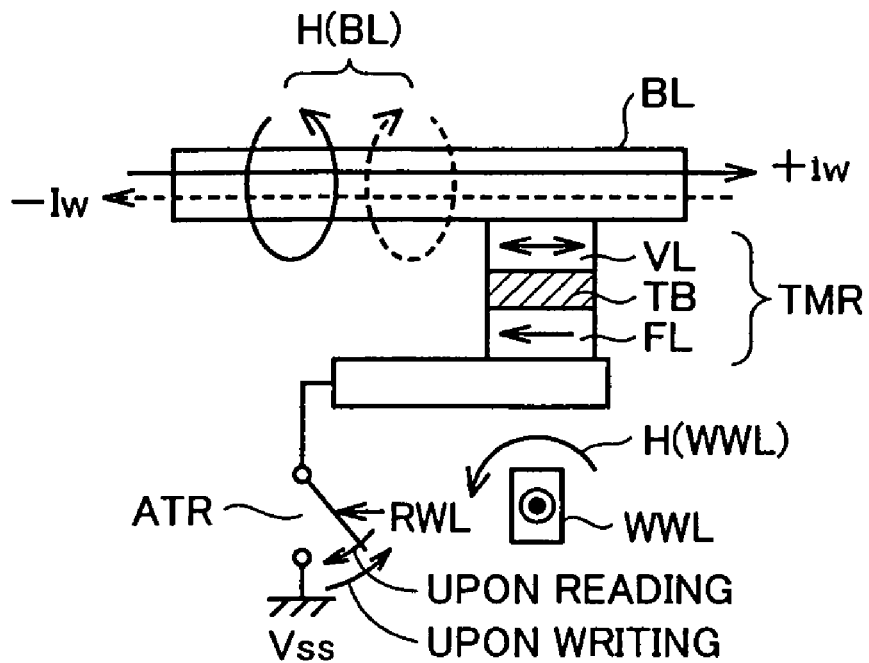
FIG. 3 is a conceptual diagram illustrating a configuration and data storage principle of an MTJ memory cell.

Referring to FIG. 3, tunneling magneto-resistance element TMR has a ferromagnetic layer (hereinafter, also simply referred to as the "fixed magnetic layer") FL having a fixed, constant direction of magnetization, and a ferromagnetic layer (hereinafter, also simply referred to as the "free magnetic layer") VL magnetized in a direction corresponding to an externally applied magnetic field. A tunneling barrier (tunneling film) TB of an insulating film is provided between fixed magnetic layer FL and free magnetic layer VL. Free magnetic layer VL is magnetized in a direction the same as or opposite to fixed magnetic layer FL in accordance with the level of the stored data to be written.

Fixed magnetic layer FL, tunneling barrier TB and free magnetic layer VL form a magnetic tunnel junction.

The resistance of tunneling magneto-resistance element TMR changes in accordance with a relative relation between the magnetization directions of fixed magnetic layer FL and free magnetic layer VL. Specifically, the resistance of tunneling magneto-resistance element TMR becomes a minimal value Rmin when the magnetization directions of fixed magnetic layer FL and free magnetic layer VL are the same (parallel), while it becomes a maximal value Rmax when the two layers have opposite (anti-parallel) magnetization directions.

At the time of data write, read word line RWL is inactivated, and access transistor ATR is turned off. In this state, data write magnetic fields H (BL) and H (WWL) for magnetizing free magnetic layer VL are generated by data write currents flowing through bit line BL and write word line WWL, respectively. In particular, the data write current on bit line BL flows in a direction of either +Iw or −Iw, dependent on a level of write data.

Figure 4:
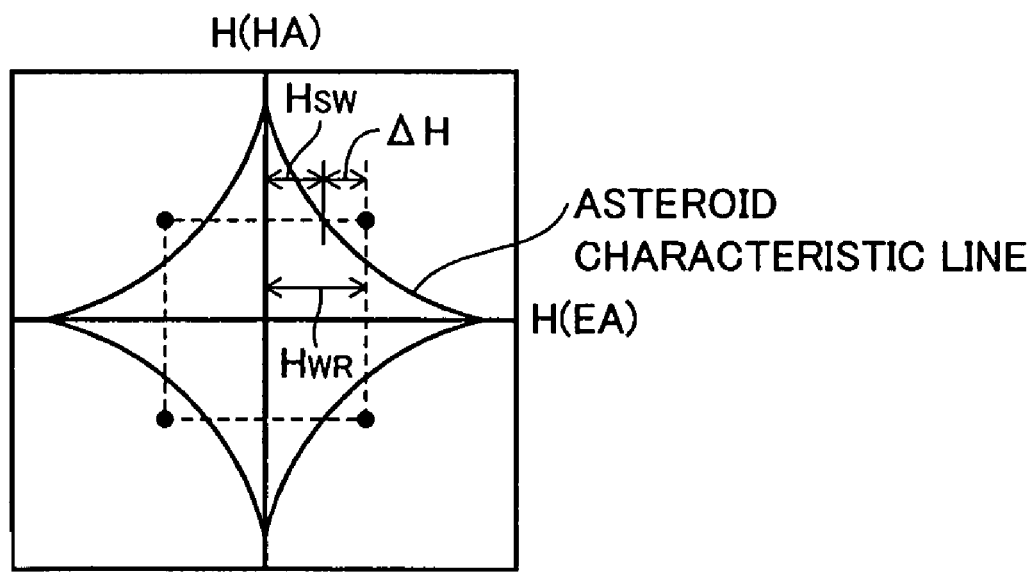
FIG. 4 is a conceptual diagram illustrating a relation between a data write current of the MTJ memory cell and a magnetization direction of a tunneling magneto-resistance element.

FIG. 4 is a conceptual diagram illustrating a relation between the data write current of the MTJ memory cell and the magnetization direction of the tunneling magneto-resistance element.

Referring to FIG. 4, the horizontal axis H (EA) represents a magnetic field being applied to free magnetic layer VL in tunneling magneto-resistance element TMR in an easy-to-magnetize axis (EA: Easy Axis) direction. The vertical axis H (HA) represents a magnetic field acting on free magnetic layer VL in a hard-to-magnetize axis (HA: Hard Axis) direction. Magnetic fields H (EA) and H (HA) correspond to data write magnetic fields H (BL) and H (WWL), respectively, shown in FIG. 3.

In the MTJ memory cell, the fixed magnetization direction of fixed magnetic layer FL is along the easy axis of free magnetic layer VL. Free magnetic layer VL is magnetized along the easy axis direction, parallel (same) or anti-parallel (opposite) to the magnetization direction of fixed magnetic layer FL, in accordance with the level of the stored data. The MTJ memory cell can store data of one bit corresponding to respective one of the two magnetization directions of free magnetic layer VL.

The magnetization direction of free magnetic layer VL can be rewritten only in the case where a sum of applied magnetic fields H (EA) and H (HA) reaches a region outside the asteroid characteristic line shown in FIG. 4. In other words, the magnetization direction of free magnetic layer VL would not change when the data write magnetic fields applied have intensity that falls into the region inside the asteroid characteristic line.

As seen from the asteroid characteristic line, a magnetization threshold value necessary to cause a change in magnetization direction of free magnetic layer VL along the easy axis can be lowered by applying the magnetic field in the hard axis direction to free magnetic layer VL. As shown in FIG. 4, the operating point at the time of data write is designed such that the stored data in the MTJ memory cell, i.e., the magnetization direction of tunneling magneto-resistance element TMR, can be rewritten when prescribed data write currents are passed through both write word line WWL and bit line BL.

With the operating point shown in FIG. 4 by way of example, in the MTJ memory cell as a target of data write, the data write magnetic field in the easy axis direction is designed to have an intensity of $H_{WR}$. In other words, the value of the data write current to be passed through bit line BL or write word line WWL is designed such that the relevant data write magnetic field $H_{WR}$ is obtained. In general, data write magnetic field $H_{WR}$ is expressed by a sum of a switching magnetic field $H_{SW}$ necessary to switch the magnetization directions and a margin ΔH, i.e., $H_{WR}=H_{SW}+$ ΔH.

The magnetization direction once written into tunneling magneto-resistance element TMR, i.e., the stored data in the MTJ memory cell, is held in a non-volatile manner until data is newly written. Although the resistance of each memory cell exactly corresponds to a sum of the resistance of tunneling magneto-resistance element TMR, an on resistance of access transistor ATR and other parasitic resistances, the resistance values other than that of tunneling magneto-resistance element TMR are constant irrelevant to stored data. Thus, hereinafter, the two kinds of resistances of a normal memory cell in accordance with stored data are also represented as Rmax and Rmin, and a difference therebetween is represented as ΔR (i.e., ΔR=Rmax−Rim).

At the time of data read, the resistance level of a selected memory cell, or the stored data level, can be read by detecting, via bit line BL, a current passing through tunneling magneto-resistance element TMR when access transistor ATR is turned on.

Figure 5:
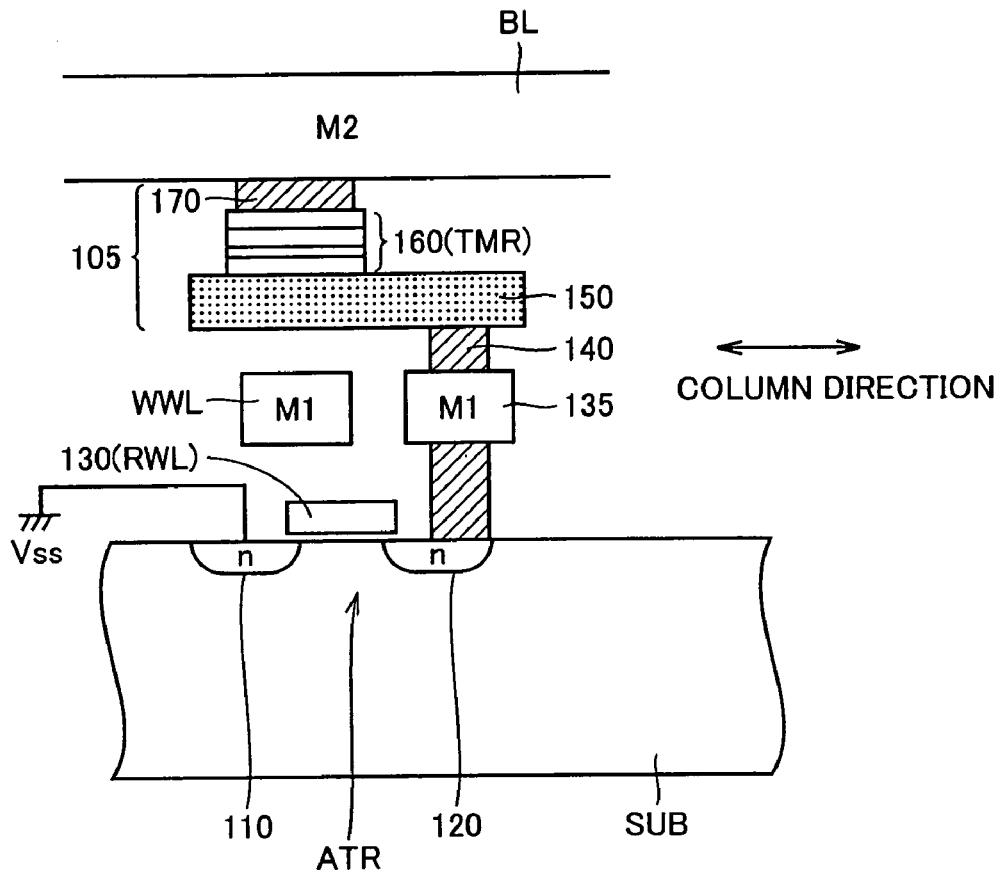
FIG. 5 is a cross sectional view showing a structure of the MTJ memory cell.

FIG. 5 is a cross sectional view showing a structure of the MTJ memory cell.

Referring to FIG. 5, the MTJ memory cell includes an access transistor ATR formed on a semiconductor substrate SUB, and a conductive magnetic film 105.

Access transistor ATR includes a source and a drain formed as impurity regions 110, 120 on semiconductor substrate SUB. Typically, a MOS transistor, which is a field effect transistor formed on a semiconductor substrate, is employed as access transistor ATR.

Impurity region 110 is connected to a ground voltage Vss, and serves as the source. Impurity region 120 is electrically connected to conductive magnetic film 105 via a metal interconnection 135 provided in a metal interconnection layer M1 and a via contact 140 provided in a contact hole, and serves as the drain.

Read word line RWL is provided for control of a gate voltage of access transistor ATR, through which line it is unnecessary to pass a current aggressively. Thus, from the standpoint of increasing the density, read word line RWL is formed with a polysilicon layer or a polycide structure in the same interconnection layer as a gate 130, without provision of an additional, independent metal interconnection layer. By comparison, write word line WWL and bit line BL, through which the data write currents should be passed, are formed using metal interconnection layers M1 and M2, respectively.

Conductive magnetic film 105 has a stacked structure of a lead interconnection 150, a tunneling magnetic layer 160 corresponding to tunneling magneto-resistance element TMR, and a via contact 170. Lead interconnection 150 is provided for electrically connecting tunneling magnetic layer 160 with via contact 140. Via contact 170 electrically connects tunneling magnetic layer 160 with bit line BL. Lead interconnection 150 and via contact 170 are formed of metal films.

Figure 6:
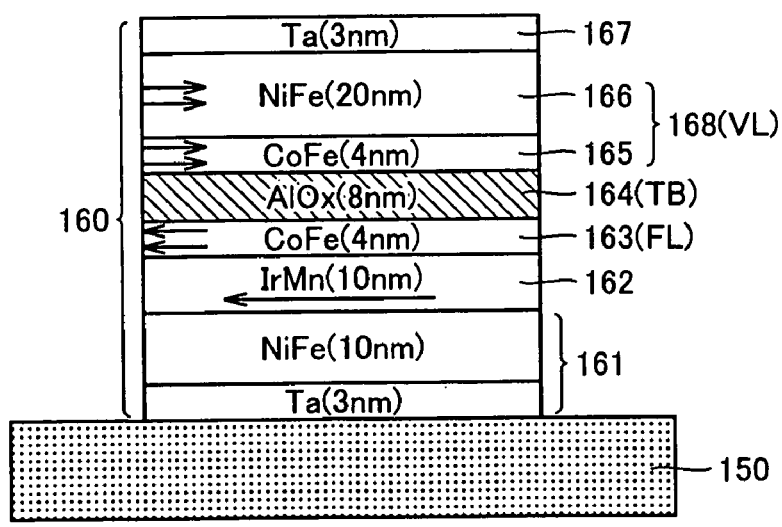
FIG. 6 is a cross sectional view showing by way of example a structure of the tunneling magnetic layer.

Referring to FIG. 6, tunneling, magnetic layer 160 includes: a NiFe film and a Ta film provided as an underlayer 161; an antiferromagnetic layer 162 formed of an IrMn film; magnetic layers 163 and 165 formed of CoFe films; an insulating layer 164 (AlOx) sandwiched between magnetic layers 163 and 165; a magnetic layer 166 formed of a NiFe film; and a protective layer 167 formed of a Ta film.

Magnetic layer 163 corresponds to fixed magnetic layer FL in FIG. 3, while magnetic layers 165, 166 correspond to free magnetic layer VL in FIG. 3. Insulating layer 164 corresponds to tunneling barrier TB in FIG. 3. Typical thicknesses of the respective layers are shown in the parentheses in FIG. 6.

Referring again to FIG. 2, the configuration of the memory array is described in detail.

Normal memory cells MC in every other row are connected to either one of bit lines BL and /BL. For example, focusing on the normal memory cells belonging to the first memory cell column, the normal memory cell in the first row is coupled to bit line /BL1, and the normal memory cell in the second row is coupled to bit line BL1. Likewise, the normal memory cells and the spare memory cells in the odd rows are connected to one bit lines /BL1-/BLm, while those in the even rows are connected to the other bit lines BL1-BLm. Similarly, spare memory cells SMC are connected to spare bit lines /SBL1-/SBLk in the odd rows, and connected to spare bit lines SBL1-SBLk in the even rows.

Memory array 10 further has a plurality of dummy memory cells DMC which are coupled respectively to bit lines BL1, /BL1 to BLm, /BLm and spare bit lines SBL1, /SBL1 to SBLk, /SBLk.

Each dummy memory cell DMC has a dummy resistance element TMRd and a dummy access element ATRd. A resistance sum Rd of dummy resistance element TMRd and dummy access element ATRd is set to an intermediate value of resistances Rmax and Rmin corresponding respectively to the H level and the L level of data stored in MTJ memory cell MC, to satisfy Rmax>Rd>Rmin. Dummy access element ATRd is typically formed of a field effect transistor, as with the access element of the MTJ memory cell. Thus, hereinafter, the dummy access element is also referred to as the dummy access transistor ATRd.

Dummy memory cells DMC are arranged in two rows× (m+k) columns, to correspond to either one of dummy read word lines DRWL1 and DRWL2. The dummy memory cells corresponding to dummy read word line DRWL1 are coupled respectively to bit lines BL1-BLm and spare bit lines SBL1-SBLk. The remaining dummy memory cells corresponding to dummy read word line DRWL2 are coupled respectively to bit lines /BL1-/BLm and spare bit lines /SBL1-/SBLk. Hereinafter, dummy read word lines DRWL1 and DRWL2 are also collectively referred to as dummy read word line DRWL.

Further, dummy write word lines DWWL1, DWWL2 are arranged corresponding to respective dummy memory cell rows. Although the arrangement of the dummy write word lines may be unnecessary for dummy resistance element TMRd of a certain structure, dummy write word lines DWWL1, DWWL2 designed in the same manner as write word line WWL are preferably provided to guarantee continuity in shape on the memory array and to avoid complexity of the manufacturing process.

At the time of data read, word line driver 30 selectively activates read word lines RWL and dummy read word lines DRWL1, DRWL2 to an H level (of power supply voltage Vcc1) in accordance with the row selection result. Specifically, when an odd row is selected and the normal memory cells and the spare memory cells in the selected row are connected to bit lines /BL1-/BLm and spare bit lines /SBL1-/SBLk, then dummy read word line DRWL1 is also activated, and the dummy memory cells are connected to bit lines BL1-BLm and spare bit lines SBL1-SBLk. By comparison, when an even row is selected, dummy read word line DRWL2 is activated in addition to the read word line of the selected row.

At the time of data write, word line driver 30 couples an end of write word line WWL of the selected row to power supply voltage Vcc2. This permits a data write current Ip in the row direction to flow on write word line WWL of the selected row, from word line driver 30 toward region 40. The write word lines of non-selected rows are coupled to ground voltage Vss by word line driver 30.

Column select lines CSL1-CSLm for performing column selection are provided corresponding to respective memory cell columns. Column decoder 25 activates one of column select lines CSL1-CSLm to a selected state (of an H level) at each time of data write and data read, in accordance with a decoded result of column address CA, i.e., the column selection result.

Further, spare column select lines SCSL1-SCSLk are provided corresponding to respective spare memory cell columns. Spare column drivers SCV1-SCVk, in response to spare enable signals SE1-SEk from redundancy program circuit 100, activate corresponding spare column select lines to a selected state (of an H level). Generation of spare enable signals SE1-SEk will be described later in detail.

Still further, a data bus pair DBP is arranged for transmitting read data and write data. Data bus pair includes complementary data buses DB and /DB.

Read/write control circuit 50 includes a data write circuit 51W, a data read circuit 51R, column select gates CSG1-CSGm provided corresponding to respective memory cell columns, and spare column select gates SCSG1-SCSGk provided corresponding to respective spare memory cell columns.

Hereinafter, column select lines CSL1-CSLm, spare column select lines SCSL1-SCSLk, column select gates CSG1-CSGm, and spare column select gates SCSG1-SCSGk are also collectively referred to as column select line CSL, spare column select line SCSL, column select gate CSG, and spare column select gate SCSG, respectively.

Each column select gate CSG has a transistor switch electrically coupled between data bus DB and corresponding bit line BL, and a transistor switch electrically coupled between data bus /DB and corresponding bit line /BL. The transistor switches turn on/off in accordance with a voltage of corresponding column select line CSL. That is, each column select gate CSG, when corresponding column select line CSL is activated to a selected state (of an H level), electrically connects data buses DB and /DB with corresponding bit lines BL and /BL, respectively.

Each spare column select gate SCSG has the same configuration as column select gate CSG. It electrically connects corresponding spare bit lines SBL and /SBL with data buses DB and /DB when corresponding spare column select line SCSL is activated to a selected state (of an H level).

Read/write control circuit 60 has short-circuit switch transistors 62-1 to **62-*m*, 62-*s*1 to 62-*sk*, and control gates 66-1 to 66-*m* and 66-*s*1 to 66-*sk*, provided corresponding to respective memory cell columns. Read/write control circuit 60 further has precharge transistors 64-1*a*, 64-1*b* to 64-*ma*, 64-*mb* and 64-*s*1*a*, 64-*s*1*b* to 64-*ska*, 64-*skb***, which are provided between bit lines BL1, /BL1 to BLm, /BLm and spare bit lines SBL1, /SBL1 to SBLk, /SBLk and ground voltage Vss, respectively.

Hereinafter, short-circuit switch transistors 62-1 to 62-m, **62-*s*1 to 62-*sk*, precharge transistors 64-1*a*, 64-1*b* to 64-*ma*, 64-*mb* and 64-*s*1*a*, 64-*s*1*b* to 64-*ska*, 64-*skb*, and control gates 66-1 to 66-*m* and 66-*s*1 to 66-*sk*** are also collectively referred to as short-circuit switch transistor 62, precharge transistor 64 and control gate 66, respectively.

Each control gate 66 outputs an AND operation result between corresponding column select line CSL or spare column select line SCSL and a control signal WE. Thus, in the data write operation, the output of control gate 66 is selectively activated to an H level in a selected column corresponding to column address CA or a spare column.

Short-circuit switch transistor 62 turns on/off in response to the output of corresponding control gate 66. Thus, in the data write operation, in a selected column corresponding to column address CA or a spare column, ends of bit lines BL and /BL or ends of spare bit lines SBL and /SBL are electrically connected to each other by short-circuit switch transistor 62.

Each precharge transistor 64 turns on in response to activation of a bit line precharge signal BLPR, and precharges each of bit lines BL1, /BL1 to BLm, /BLm and spare bit lines SBL1, /SBL1 to SBLk, /SBLk to ground voltage Vss. Bit line precharge signal BLPR, generated by control circuit 5, is activated to an H level in an active period of MRAM device 1, at least for a prescribed time period before execution of data read. By comparison, during the data read operation and the data write operation in the active period of MRAM device 1, bit line precharge signal BLPR is inactivated to an L level, and precharge transistor 64 is turned off.

Now, the column select operation in MRAM device 1 is described. As already described above, the column select operation includes the redundancy control for the purpose of replacement/repair of a defective column.

Redundancy program circuit 100 includes a plurality of redundancy control units RPU(1)-RPU(k) provided corresponding to redundant circuits (spare columns) RD1-RDk, respectively. Redundancy control units RPU(1)-RPU(k) can store therein defective addresses FAD1-FADk, respectively. The i-th redundancy control unit RPU(i) determines whether column address CA of h bits (h is a natural number) for indicating a selected column matches a programmed defective address FADi. The configurations of redundancy control unit RPU(i) and of program elements included therein will be described later in detail.

Redundancy control unit RPU(i) stores defective address FADi in a fixed manner, and activates corresponding spare enable signal SEi to an H level when the column address CA matches corresponding defective address FADi. A normal enable signal NE is activated to an H level when column address CA does not match any of defective addresses FAD1-FADk.

Column decoder 25, when normal enable signal NE is activated to an H level, activates one column select line CSL corresponding to column address CA. In response, an access to a normal memory cell is carried out.

By comparison, when normal enable signal NE is inactivated to an L level, i.e., when column address CA matches any one defective address FAD, column decoder 25 inactivates each of column select lines CSL1-CSLm corresponding to the normal memory cells. On the other hand, one of spare column select lines SCSL1-SCSLk is activated in response to activation of any one of spare enable signals SE1-SEk. Thus, an access to a spare memory cell, instead of the access to a normal memory cell, is carried out.

Figure 7:
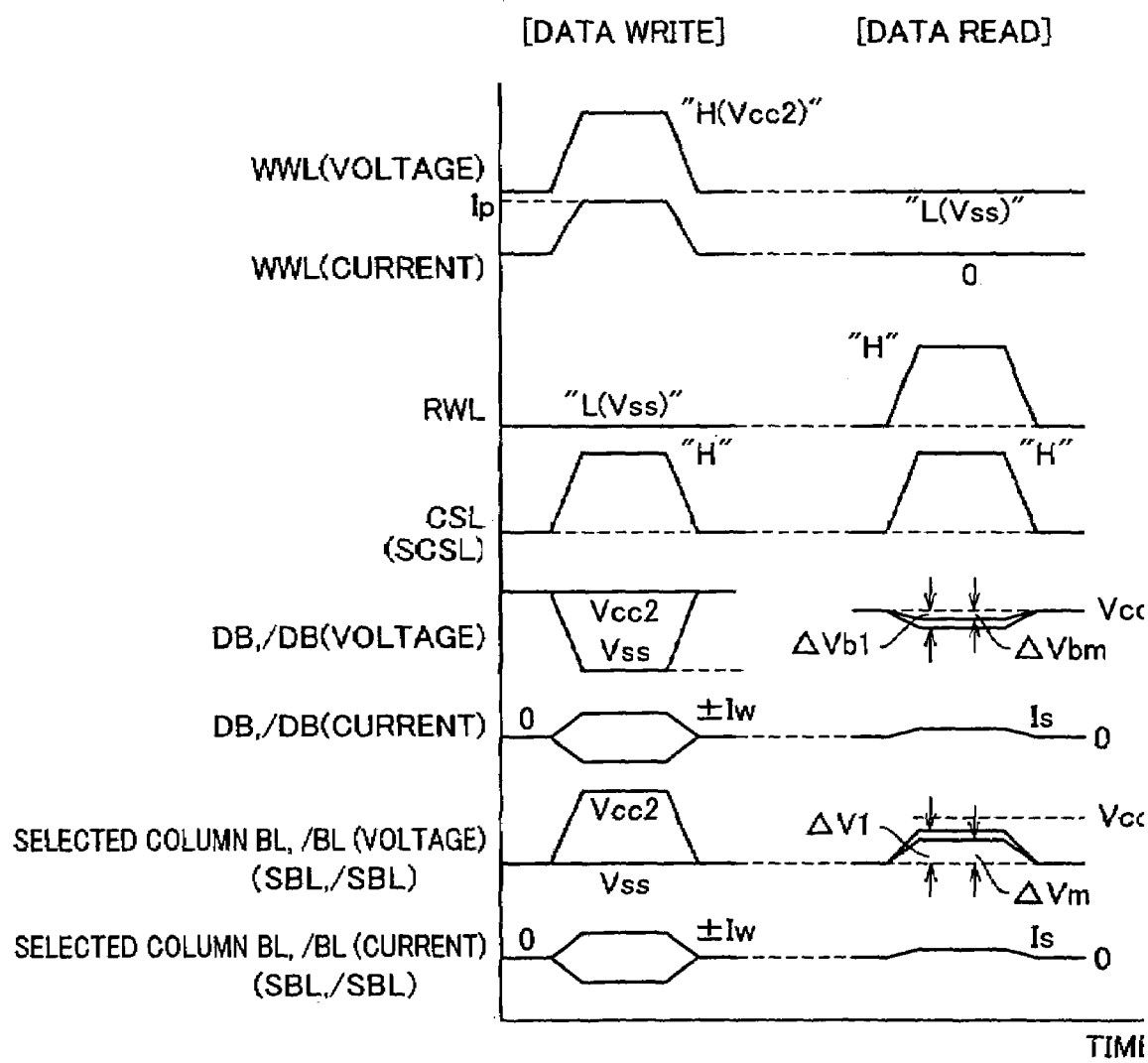
FIG. 7 shows operational waveforms during a data read operation and a data write operation, for illustrating replacement/repair in the MRAM device shown in FIGS. 1 and 2.

FIG. 7 shows operational waveforms during a data read operation and a data write operation, for illustrating replacement/repair in MRAM device 1.

Firstly, the operation at the time of data write is described. Word line driver 30, in accordance with a row selection result of row decoder 20, activates and connects write word line WWL corresponding to the selected row to power supply voltage Vcc2. Since an end of each write word line WWL is coupled to ground voltage Vss in region 40, a data write current Ip is passed through write word line WWL of the selected row in a direction from word line driver 30 toward region 40. The data write current is not passed through write word line WWL of a non-selected row, as it is maintained in an inactive state (L level: ground voltage Vss).

When column address CA does not match any of defective addresses FAD1-FADk, column select line CSL of the selected column corresponding to column address CA is activated to a selected state (of an H level), and one ends of bit lines BL and /BL of the selected column are coupled to data buses DB and /DB, respectively. Further, corresponding short-circuit switch transistor 62 (FIG. 2) turns on, to short circuit the other ends (opposite from the column select gate CSG side) of bit lines BL and /BL of the selected column.

When column address CA matches any one of defective addresses FAD1-FADk, corresponding spare column select line SCSL is activated to a selected state (of an H level), and one ends of corresponding spare bit lines SBL and /SBL, instead of bit lines BL and /BL of the selected column, are coupled to data buses DB and /DB, respectively. Further, corresponding short-circuit switch transistor 62 (FIG. 2) turns on, to short circuit the other ends (opposite from the spare column select gate SCSG side) of corresponding spare bit lines SBL and /SBL.

Data write circuit 51W sets data buses DB and /DB to one and the other of power supply voltage Vcc2 and ground voltage Vss. For example, when write data DIN has a data level of L level, a data write current −Iw for writing of L level data is passed through data bus DB. Data write current −Iw is supplied to bit line BL of the selected column or to corresponding spare bit line SBL, via column select gate CSG or spare column select gate SCSG.

Data write current −Iw passed through bit line BL of the selected column or corresponding spare bit line SBL is turned or folded back by short-circuit switch transistor 62. Thus, a data write current +Iw in the opposite direction is passed through the other bit line /BL or spare bit line /SBL. Data write current +Iw flowing through bit line /BL or spare bit line /SBL is transmitted to data bus /DB via column select gate CSG or spare column select gate SCSG.

When write data DIN has a data level of H level, the data write currents in the opposite directions can be passed through bit lines BL, /BL of the selected column or corresponding spare bit lines SBL, /SBL by reversing the voltage settings of data buses DB and /DB.

As such, when column address CA does not match any of defective addresses FAD1-FADk, data write is performed on a normal memory cell (selected memory cell) having data write currents passed through both corresponding write word line WWL and bit line BL (/BL). By comparison, when column address CA matches any one defective address FAD, data write is performed on a spare memory cell having data write currents passed through both corresponding write word line WWL and spare bit line SBL (/SBL).

At the time of data write, read word line RWL is maintained in a non-selected state (of an L level). Bit line precharge signal BLPR is activated to an H level also at the time of data write, so that the voltages of bit lines BL and /BL upon data write are set to ground voltage Vss corresponding to the precharged voltage level at the time of data read. Thus, by matching the voltages of bit lines BL, /BL corresponding to a non-selected column and of spare bit lines SBL, /SBL after data write with the precharged voltage for data read, an additional precharging operation before data read becomes unnecessary, so that the data read operation is accelerated.

Now, the data read operation is described.

At the time of data read, word line driver 30 activates read word line RWL corresponding to a selected row to an H level in accordance with the row selection result of row decoder 20. In a non-selected row, the voltage level of read word line RWL is maintained in an inactive state (of an L level).

At the start of data read, read word line RWL of the selected row is activated to an H level, and corresponding access transistors ATR turn on. The normal memory cells and the spare memory cells corresponding to the selected row are electrically connected between bit line BL, /BL and spare bit line SBL, /SBL and ground voltage Vss, respectively, via access transistors ATR.

Data read circuit 51R pulls up each of data buses DB and /DB with power supply voltage Vcc1, and supplies a constant sense current Is.

Further, in accordance with column address CA, column select line CSL of the selected column or corresponding spare column select line SCSL is activated to a selected state (of an H level), as in the case of data write.

When column address CA does not match any of defective addresses FAD1-FADk, sense current Is flows through tunneling magneto-resistance element TMR of the selected memory cell (normal memory cell) via data bus DB (/DB) and bit line BL (/BL) of the selected column. Thus, a voltage change corresponding to the resistance (Rmax, Rmin) of the selected memory cell, or the stored data level, occurs in one of bit lines BL and /BL of the selected column and in one of data buses DB and /DB. Similarly, in the other of bit lines BL and /BL of the selected column and in the other of data buses DB and /DB, a voltage change corresponding to the resistance Rd of dummy memory cell DMC occurs.

For example, in the case where the stored data level of the selected memory cell is "1" (resistance Rmax), a voltage change $\Delta V1$ occurs on one of bit lines BL and /BL coupled to the selected memory cell that is greater than a voltage change $\Delta Vm$ occurring in the other of bit lines BL and /BL coupled to dummy memory cell DMC ($\Delta V1 > \Delta Vm$). Similarly, voltage changes $\Delta Vb1$ and $\Delta Vbm$ occur on data buses DB and /DB ($\Delta Vbm > \Delta Vb1$). By using data read circuit 51R to sense and amplify the voltage difference thus generated between data buses DB and /DB, the stored data in the selected memory cell can be output as read data DOUT.

On the other hand, when column address CA matches any of defective addresses FAD1-FADk, sense current Is flows through a spare memory cell via data bus DB (/DB) and spare bit line SBL (/SBL). Thus, a voltage change corresponding to the resistance (Rmax, Rmin) of the spare memory cell, or the stored data level, occurs on one of spare bit lines SBL and /SBL and on one of data buses DB and /DB. A voltage change corresponding to resistance Rd of dummy memory cell DMC occurs on the other of spare bit lines SBL, /SBL and on the other of data buses DB, /DB, as in the case where a normal memory cell is accessed.

As such, even if a defective column is selected by column address CA, data write and data read can be carried out without fault by accessing a spare memory cell of corresponding redundant circuit (spare column). Thus, it is possible to replace/repair a defective memory cell in a unit of memory cell column using a spare column corresponding to a redundant circuit.

Further, the precharge voltages of bit lines BL, /BL and spare bit lines SBL, /SBL are set to ground voltage Vss. This prevents a discharge current from flowing in a non-selected column from bit lines BL, /BL and spare bit lines SBL, /SBL via access transistors turned on in response to activation of read word line RWL of a selected row. As a result, power consumption due to charge/discharge of the bit lines and the spare bit lines during the precharging operation can be reduced.

In addition, the voltage Vcc2 as the operating power supply voltage of data write circuit 51W is set higher than the voltage Vcc1 as the operating power supply voltage of data read circuit 51R. This is because the data write currents Ip, ±Iw necessary to magnetize tunneling magneto-resistance element TMR of a selected memory cell at the time of data write is greater than the sense current Is necessary for data read. For example, if an external power supply voltage supplied from the outside of MRAM device 1 is employed as power supply voltage Vcc2 without converting, and this external power supply voltage is processed by a voltage down converter (not shown) to generate power supply voltage Vcc1, then power supply voltages Vcc1 and Vcc2 can be supplied efficiently.

Now, the configuration of the program element according to the first embodiment is described in detail.

Figure 8:
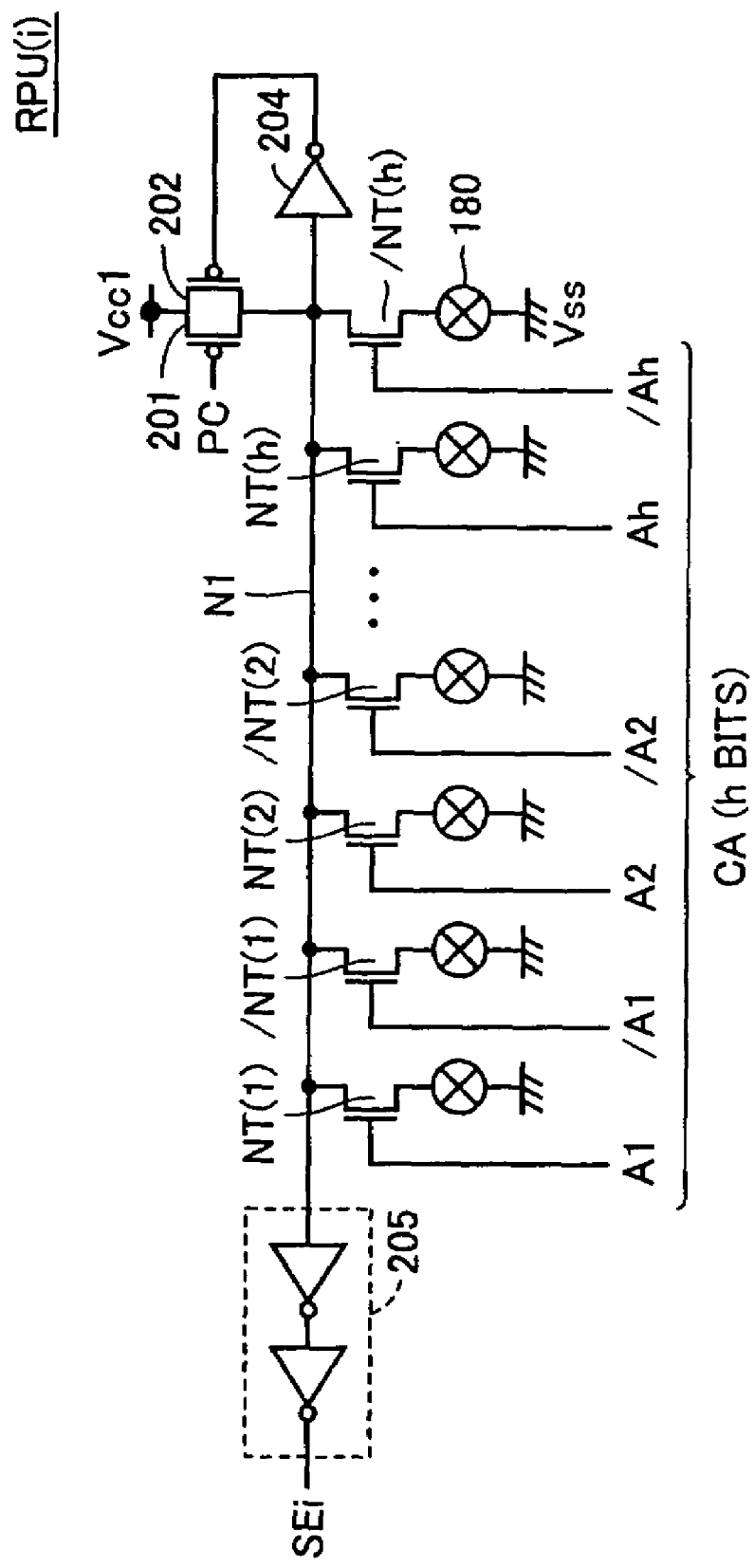
FIG. 8 is a circuit diagram showing a configuration of a redundancy control unit as an application example of the program element according to the first embodiment.

FIG. 8 is a circuit diagram showing the configuration of redundancy control unit RPU(i) shown in FIG. 2. Redundancy control unit RPU(i) is indicated as an application example of the program element according to the first embodiment.

Referring to FIG. 8, redundancy control unit RPU(i) stores a defective address FADi of h bits with 2×h program elements 180 in a fixed manner, and performs matching between an input column address CA and defective address FADi. Column address CA is formed of address bits A1-Ah.

Redundancy control unit RPU has 2×h N-MOS transistors NT(1), /NT(1) to NT(h), /NT(h) electrically connected between a node N1 and a ground voltage Vss via program elements 180. N-MOS transistor NT(1) has its gate receiving input of address bit A1, and N-MOS transistor /NT(1) has its gate receiving input of an inverted bit /A1 of address bit A1. Likewise, transistors NT(2)-NT(h) and /NT(2)-/NT(h) have their gates receiving inputs of address bits A2-Ah and their inverted bits /A2-/Ah, respectively.

Program elements 180 provided corresponding to respective address bits A1-Ah and their inverted bits /A1-/Ah are selectively blown in response to the respective bits of defective address FADi.

Redundancy control unit RPU(i) further has P-MOS transistors 201, 202 connected in parallel with each other between a power supply voltage Vcc1 and node N1, an inverter 204, and a signal driver 205. P-MOS transistor 201 has its gate receiving input of a precharge signal PC. Inverter 204 inverts the voltage level of node N1 and inputs the same to a gate of P-MOS transistor 202. Signal driver 205 generates a spare enable signal SEi in accordance with the voltage level of node N1.

Prior to each address input cycle of MRAM device 1, precharge signal PC is set to an L level and node N1 is precharged to power supply voltage Vcc1. Once the address input cycle is started, precharge signal PC is set to an H level, and transistors 201 and 202 turn off, so that node N1 is disconnected from power supply voltage Vcc1. In this state, in accordance with an input address, address bits A1-Ah and their inverted bits /A1-/Ah are input to the gates of N-MOS transistors NT(1)-NT(h) and /NT(1)-/NT(h), respectively.

As a result, the voltage of node N1 is maintained at power supply voltage Vcc1 of the precharged level only in the case where the input column address CA and defective address FADi have their bits completely matched with each other. In other cases, i.e., when the input address and the defective address do not match, at least one current path is formed between node N1 and ground voltage Vss, and node N1 is pulled down to ground voltage Vss.

Thus, spare enable signal SEi generated by signal driver 205 is set to an H level when defective address FADi and column address CA match with each other, and otherwise set to an L level.

Now, examples of the structure of the program element according to the first embodiment are shown.

Figure 9A:
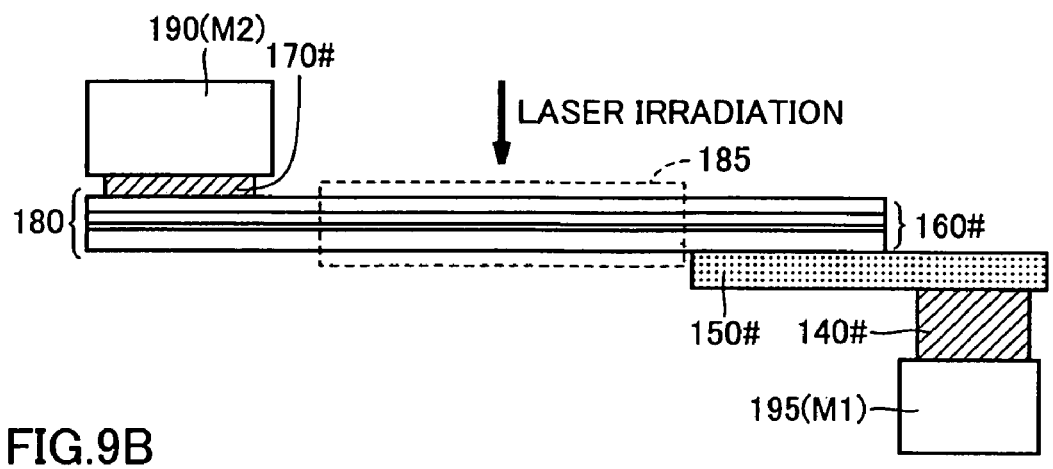
FIGS. 9A-9C show first structure examples of the program element according to the first embodiment.

Referring to FIG. 9A, the program element 180 according to the first embodiment has a magnetic layer 160#, provided at the same layer as and having the same structure as tunneling magnetic layer 160, electrically connected between a node 190 formed in a metal interconnection layer M2 and a node 195 formed in a metal interconnection layer M1. One and the other of nodes 190 and 195 are electrically connected to ground voltage Vss and a source of corresponding N-MOS transistor, as shown in FIG. 8. At least a portion of magnetic layer 160# constitutes a link portion 185 that is designed to be fusible with external laser irradiation. That is, link portion 185 forms a so-called fuse.

An electrical contact between magnetic layer 160# and node 190 is secured by a via contact 170#, as in the case of the electrical contact between tunneling magnetic layer 160 and bit line BL (metal interconnection layer M2) in the MTJ memory cell; Via contact 170# is provided in the same layer as and with the same structure as via contact 170 shown in FIG. 3.

Likewise, an electrical contact between node 195 and magnetic layer 160# is configured with a via contact 140# and a lead interconnection 150#, as in the case of the electrical contact between tunneling magnetic layer 160 and metal interconnection 135 (metal interconnection layer M1) in FIG. 3. Via contact 140# and lead interconnection 150# are provided in the same layers as and with the same structures as via contact 140 and lead interconnection 150 shown in FIG. 3.

Figure 9B:
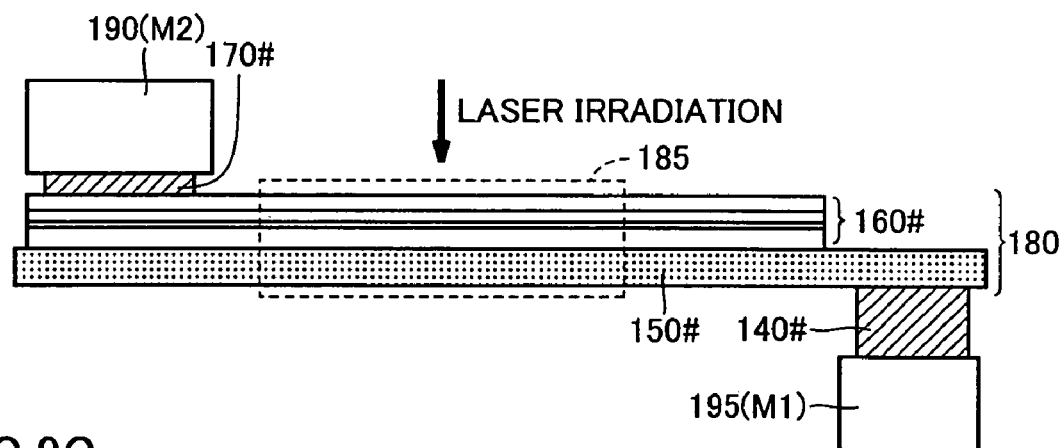

Referring to FIG. 9B, program element 180 may be formed of a metal layer 150# formed in the same layer as lead interconnection 150 and a magnetic layer 160# formed in the same layer as and with the same structure as tunneling magnetic layer 160. In this case, again, program element 180 is designed such that a portion thereof constitutes a link portion 185 which can be blown with external laser irradiation. The electrical contacts between program element 180 and respective nodes 190 and 195 are as shown in FIG. 9A, so that description thereof is not repeated.

Figure 9C:
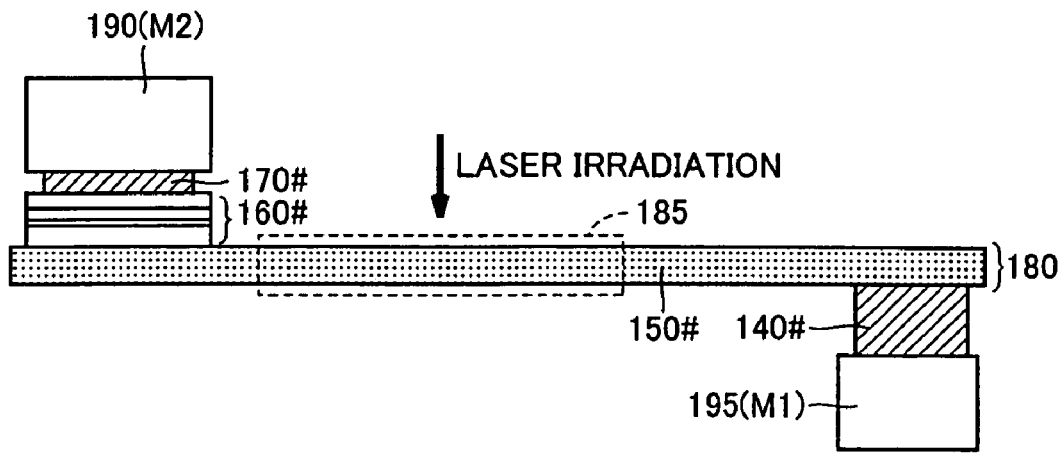

Alternatively, program element 180 may be formed of a metal layer 150# formed in the same layer as lead interconnection 150, as shown in FIG. 9C. In this case, again, it is configured such that a portion of program element 180 constitutes a link portion 185 which can be blown with external laser irradiation. The electrical contacts between program element 180 and respective nodes 190 and 195 are the same as in FIG. 9A, and thus, description thereof is not repeated.

As shown in FIGS. 9A-9C, the program element 180 according to the present embodiment is configured with at least one of metal layer 150# formed in the same layer as lead interconnection 150 in the MTJ memory cell and tunneling magnetic layer 160# formed in the same layer as tunneling magnetic layer 160. Accordingly, it is possible to manufacture a program element which can fixedly store information by blowing with external laser irradiation, in parallel with the MTJ memory cells in the manufacturing step thereof, without provision of an additional, dedicated manufacturing step.

Metal layers 150, 150# shown in FIGS. 5 and 9A-9C each have a thickness on the order of 300-1000 angstroms (1 angstrom=$10^{-10}$ m). Thus, conditions suitable for laser blowing the multilayer film of metal layer 150# and tunneling magnetic layer 160# will be, e.g., laser wavelength=0.5-1.5 μm, laser spot diameter=0.5-5 μm, and laser pulse length=5-30 ns. Any configuration from among FIGS. 9A-9C may be employed depending on film or material of each magnetic layer and in accordance with the laser bowing conditions and the resistance value when the fuse is not blown.

Further, as in the structure examples in FIGS. 9A-9C, nodes 190 and 195 to which program element 180 is connected may be arranged at upper and lower layers, respectively, of program element 180, to make the electrical contacts between program element 180 and nodes 190, 195 the same as the electrical contacts in the MTJ memory cell (FIG. 5). As a result, peeling between the respective layers and others can be prevented, enabling stable manufacture of program element 180.

Figure 10A:
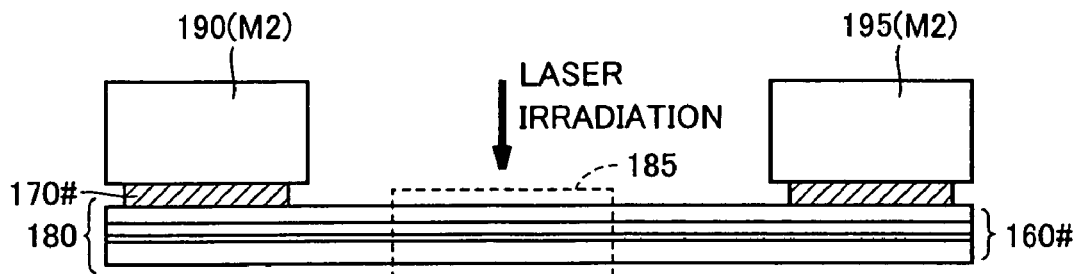
FIGS. 10A-10C show second structure examples of the program element according to the first embodiment.
Figure 10B:
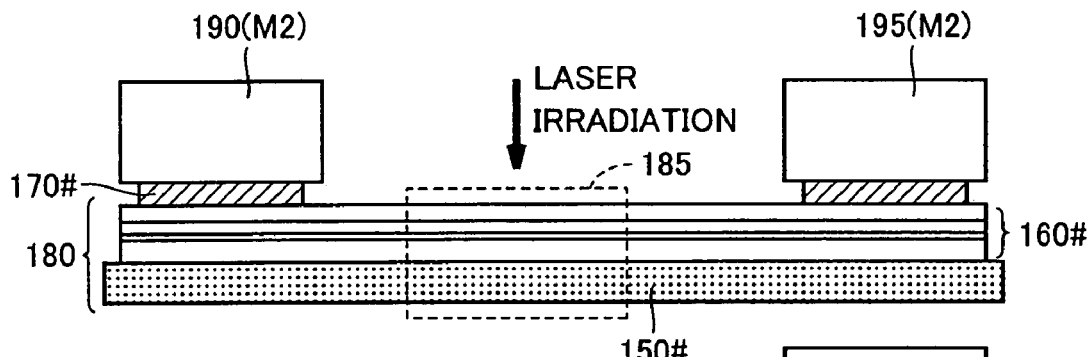
Figure 10C:
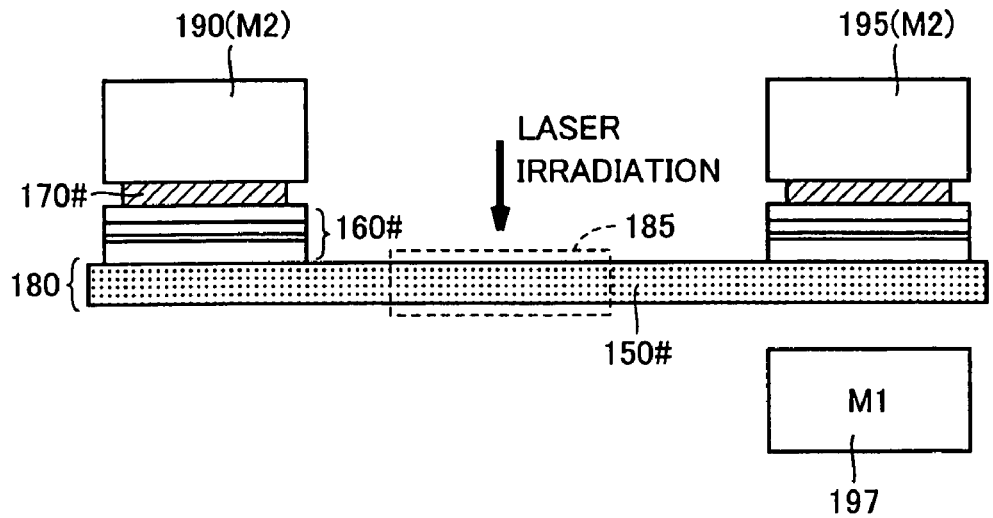

The program elements shown in FIGS. 10A-10C are different from those in FIGS. 9A-9C in that both nodes 190 and 195 are arranged in an upper layer of program element 180.

Correspondingly, the electrical contact structures between program element 180 and respective nodes 190 and 195 are each secured by via contact 170#, as in the case of the electrical contact between tunneling magnetic layer 160 and bit line BL (metal interconnection layer M2) in the MTJ memory cell shown in FIG. 5. Via contact 170# is provided in the same layer as and with the same structure as via contact 170 shown in FIG. 3.

With such a configuration, it is possible to arrange another signal interconnection 197 or the like in a lower layer portion of program element 180, i.e., in metal interconnection layer M1. Such efficient arrangement of signal interconnections results in reduction of chip area.

Figure 11A:
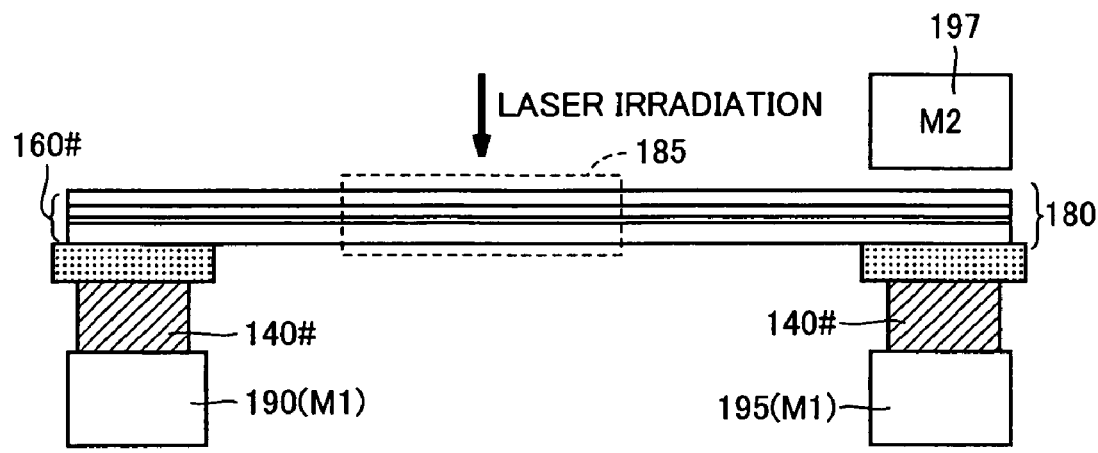
FIGS. 11A-11C show third structure examples of the program element according to the first embodiment.
Figure 11B:
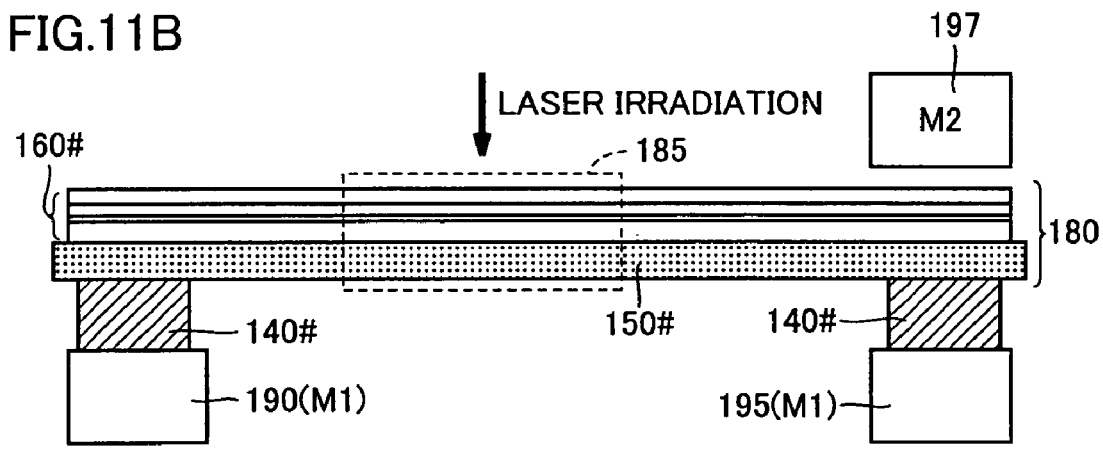
Figure 11C:
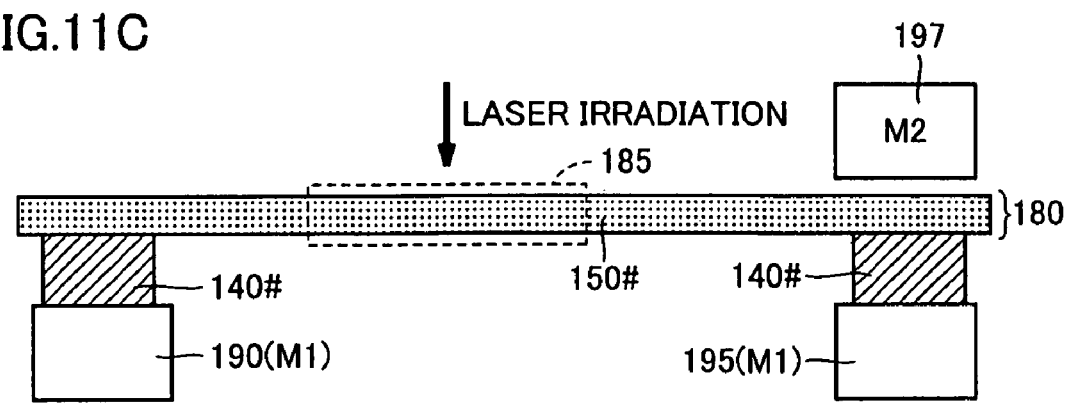

The program elements shown in FIGS. 11A-11C differ from those in FIGS. 9A-9C in that both nodes 190 and 195 are arranged in a lower layer of program element 180.

Consequently, the electrical contact structures between program element 180 and respective nodes 190 and 195 are each configured with via contact 140# and lead interconnection 150#, as in the case of the electrical contact between tunneling magnetic layer 160 and metal interconnection 135 (metal interconnection layer M1) in FIG. 3. Via contact 140# and lead interconnection 150# are provided in the same layers as and with the same structures as via contact 140 and lead interconnection 150, respectively, shown in FIG. 3.

With such a configuration, it is possible to arrange another signal interconnection 197 or the like in the upper layer portion of program element 180, i.e., in metal interconnection layer M2. As a result, chip area can be reduced with such efficient arrangement of signal interconnections.

As described above, the program element according to the first embodiment of the present invention is configured as a fuse element which utilizes the same structural portion as at least a portion of the conductive magnetic film constituting the MTJ memory cell. Thus, it can be manufactured in parallel with the MTJ memory cells in the manufacturing step thereof, without a need to provide an additional manufacturing step dedicated to the program element (or fuse). As a result, it is possible to build in a stable program element without increasing the number of manufacturing steps of the MRAM device which would otherwise increase the manufacturing cost.

Second Embodiment

In the second embodiment, a configuration of a program circuit employing the program element having the structure as described in the first embodiment and capable of programming information before and after a packaging step is described.

Figure 12:
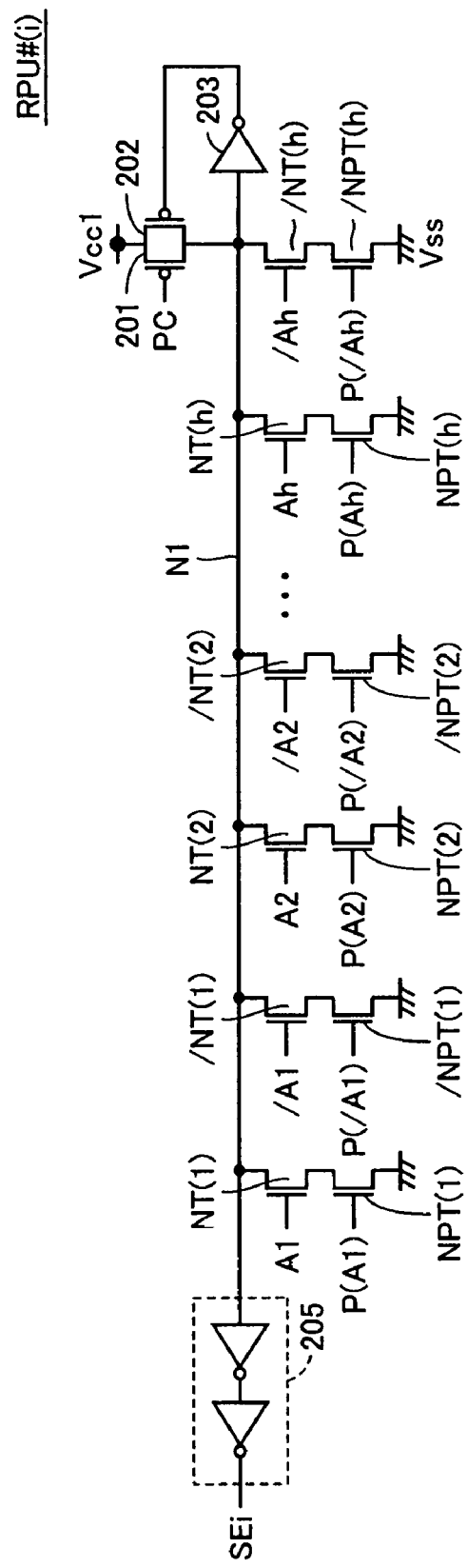
FIG. 12 is a circuit diagram showing a configuration of a redundancy control unit according to a second embodiment of the present invention.

FIG. 12 is a circuit diagram showing a configuration of a redundancy control unit RPU#(i) according to the second embodiment. The MRAM device according to the second embodiment is identical to that of the first embodiment except for the configuration of each redundancy control unit. Thus, in the following, the configuration of the redundancy control unit of the second embodiment will be described in detail, while detailed description of the configurations and operations of the other portions will not be repeated.

Referring to FIG. 12, the redundancy control unit RPU#(i) of the second embodiment differs from redundancy control unit RPU(i) of the first embodiment shown in FIG. 8 in that N-MOS transistors NPT(1), /NPT(1) to NPT(h), /NPT(h) are connected between node N1 and ground voltage Vss, instead of program elements 180. That is, in redundancy control unit RPU#(i), two N-MOS transistors connected in series are provided between node N1 and ground voltage Vss, corresponding to respective one of address bits A1-Ah and respective one of their inverted bits /A1-/Ah.

N-MOS transistors NT(1)-NT(h) and /NT(1)-/NT(h) have their gates receiving inputs of address bits A1-Ah and their inverted bits /A1-/Ah, respectively, as in the case of redundancy control unit RPU(i) shown in FIG. 8. By comparison, N-MOS transistors NPT(1), /NPT(1) to NPT(h), /NPT(h) have their gates receiving inputs of program signals P(A1), P(/A1) to P(Ah), P(/Ah), respectively, which are generated by a program circuit as will be described below.

Figure 13:
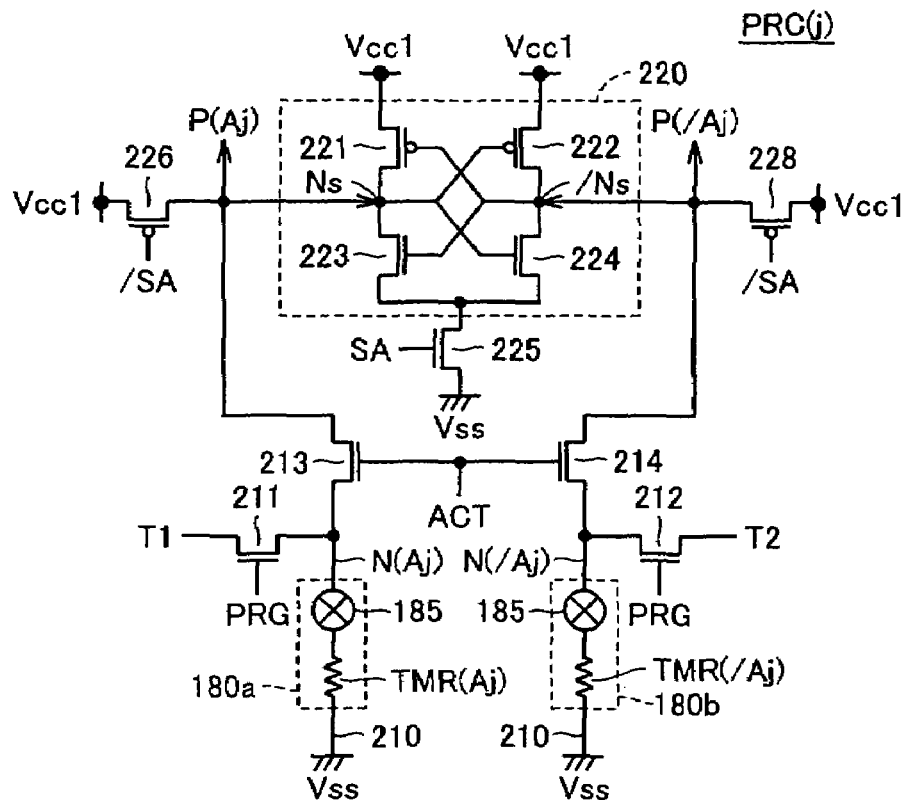
FIG. 13 is a circuit diagram showing a configuration of a program circuit according to the second embodiment.

FIG. 13 is a circuit diagram showing a configuration of the program circuit according to the second embodiment.

In FIG. 13, the configuration of the j-th (is an integer from 1 to h) program circuit PRC(j) from among h program circuits provided corresponding to respective address bits A1-Ah is shown.

Referring to FIG. 13, program circuit PRC(j) has program elements 180a, 180b, N-MOS transistors 211-214, a cross-coupled type amplifier 220, an N-MOS transistor 225 for supplying an operating current to cross-coupled type amplifier 220, and current supply transistors 226 and 228 for supplying read currents to program elements 180a, 180b.

Firstly, arrangement of program elements 180a, 180b is described.

Figure 14:
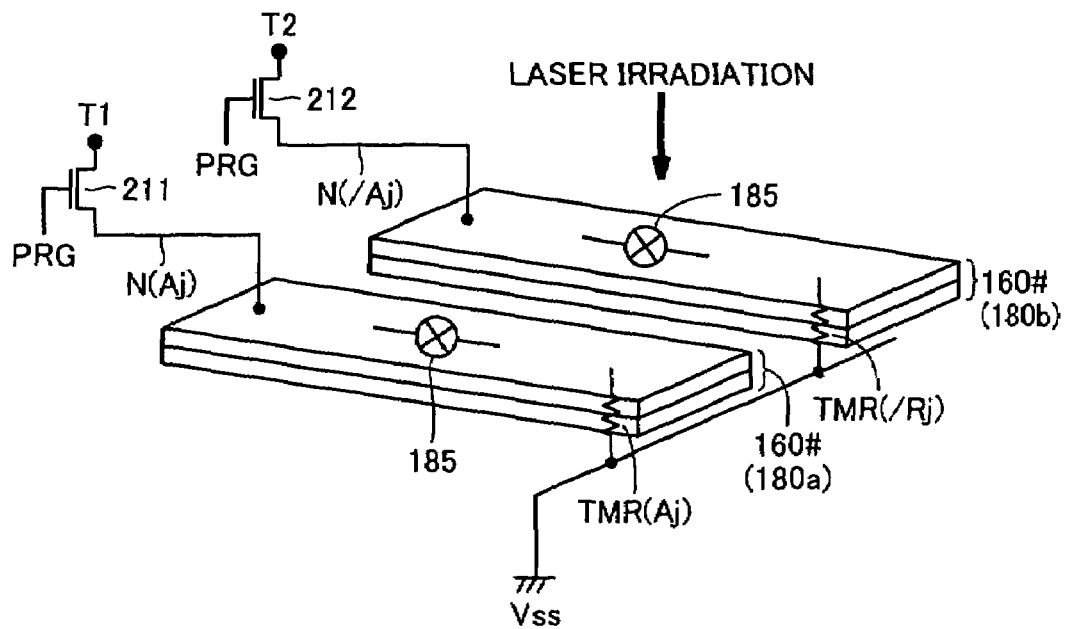
FIG. 14 shows arrangement of the program elements in the program circuit shown in FIG. 13.

FIG. 14 shows arrangement of the program elements in the program circuit shown in FIG. 13.

Program elements 180a, 180b are each formed to have the same configuration as in the first embodiment and to include at least magnetic layer 160#. That is, they are each formed as shown in FIGS. 9A, 9B, 10A, 10B, 11A, or 11B.

Referring to FIG. 14, program element 180a has at least a magnetic layer 160# that is formed in the same layer as and with the same structure as tunneling magnetic layer 160. An upper layer side of magnetic layer 160# of program element 180a is electrically connected to a node N(Aj). Node N(Aj) is connected via N-MOS transistor 211 to a node T1 which permits electrical contact from the outside after packaging. N-MOS transistor 211 has its gate receiving a control signal PRG.

A lower layer side of magnetic layer 160# constituting program element 180a is electrically connected to a ground node 210 such that tunneling magneto-resistance element TMR(Ai) is electrically connected between node N(Aj) and ground node 210.

As a result, a link portion 185 fusible with laser irradiation and tunneling magneto-resistance element TMR(Aj) are connected in series between node N(Aj) and ground node 210. The resistance of program element 180a, i.e., the resistance between node N(Aj) and ground node 210, increases as link portion 185 is blown by laser irradiation.

When link portion 185 is not blown, the resistance of program element 180a corresponds to that of tunneling magneto-resistance element TMR(Aj). Thus, application of an external voltage for giving a voltage stress sufficient to cause breakdown of the insulating film (corresponding to insulating film 164 in FIG. 4) in magnetic layer 160# to node T1 in response to activation of control signal PRG, enables breakdown of the relevant insulating film. The resistance of program element 180a is thus decreased from that before breakdown.

As such, in program element 180a, the resistance increases with laser irradiation, and decreases with an external voltage input to node T1. Program element 180b, configured in the same manner as program element 180a, has magnetic layer 160# with its upper layer side and lower layer side electrically connected to node N(/Aj) and ground node 210, respectively. Node N(/Aj) is connected via N-MOS transistor 212 to a node T2 which permits electrical contact from the outside after packaging. N-MOS transistor 212 has its gate receiving control signal PRG.

Referring again to FIG. 13, N-MOS transistors 211 and 212 are connected between nodes T1, T2 and nodes N(Aj), N(/Aj), respectively, and have their gates each receiving control signal PRG, as described in conjunction with FIG. 14. N-MOS transistor 213 is electrically connected between a node Ns at which a program signal P(Aj) is generated and node N(Aj). N-MOS transistor 214 is electrically connected between a node /Ns at which a program signal P(/Aj) is generated and node N(/Aj). N-MOS transistors 213 and 214 have their gates each receiving a control signal ACT that is activated at the time of data read from the program circuit.

Cross-coupled type amplifier 220 has P-MOS transistors 221, 222 and N-MOS transistors 223, 224. P-MOS transistor 221 is electrically connected between power supply voltage Vcc1 and node Ns, and P-MOS transistor 212 is electrically connected between power supply voltage Vcc1 and node /Ns. N-MOS transistor 223 is connected between node Ns and a drain of N-MOS transistor 225, and N-MOS transistor 224 is connected between node /Ns and the drain of N-MOS transistor 225.

P-MOS transistor 221 and N-MOS transistor 223 have their gates each electrically connected to node /Ns, and P-MOS transistor 222 and N-MOS transistor 224 have their gates each electrically connected to node Ns.

P-MOS transistor 226 is electrically connected between power supply voltage Vcc1 and node Ns, and P-MOS transistor 228 is electrically connected between power supply voltage Vcc1 and node /Ns. PMOS transistors 226 and 228 have their gates each receiving control signal /SA. N-MOS transistor 225 is electrically connected between sources of N-MOS transistors 223, 224 and ground voltage Vss, and has its gate receiving control signal SA.

Now, the operation of program circuit PRC#(j) is described.

At the time of programming to program circuit PRC#(j), laser irradiation or a voltage stress input for breakdown as described above is applied to either one of program elements 180a and 180b. This causes a resistance difference between node N(Aj) and ground node 210, and between node N(/Aj) and ground node 210.

In this state, when control signal SA is activated to an H level (/SA=L level) and control signal ACT is activated to an H level, there occurs a voltage difference between nodes Ns and /Ns corresponding to the above-described resistance difference. This voltage difference is amplified by cross-coupled type amplifier 220 provided with an operating current from N-MOS transistor 225, so that complementary program signals P(Aj) and P(/Aj) having levels corresponding to program inputs of program elements 180a and 180b are generated at nodes Ns and /Ns.

Program signals P(A1), P(/A1) to P(Ah), P(/Ah) thus generated by the program circuits according to the second embodiment are input to respective gates of N-MOS transistors NPT(1), /NPT(1) to NPT(h), /NPT(h) shown in FIG. 12. This allows N-MOS transistors NPT(1), /NPT(1) to NPT(h), /NPT(h) to function in the same manner as respective program elements 180 in redundancy control unit RPU (i) of the first embodiment shown in FIG. 7. As a result, matching between a defective address fixedly stored by a program input to program elements 180a, 180b and an input address (column address) becomes possible, as in the case of redundancy control unit RPU(i) of the first embodiment.

As described in conjunction with FIGS. 13 and 14, each of program elements 180a and 180b has a resistance that increases when laser beam is input and decreases when a voltage stress is input, compared to the case where there is no program input. Thus, in the program circuit shown in FIG. 13, one of program elements 180a and 180b may be configured with a reference resistance corresponding to a resistance inherent to tunneling magneto-resistance element TMR, in which case, a program signal can be generated in accordance with comparison of the resistance between node N(Aj) or N(/Aj) and ground node 210 with the reference resistance. In other words, as shown in FIG. 13, two program elements 180a, 180b complementarily receiving the program inputs may be used to store program information of one bit. This improves reliability of the program information.

Now, a time period for applying the program input to the program circuit according to the second embodiment is described with reference to FIG. 15.

Figure 15:
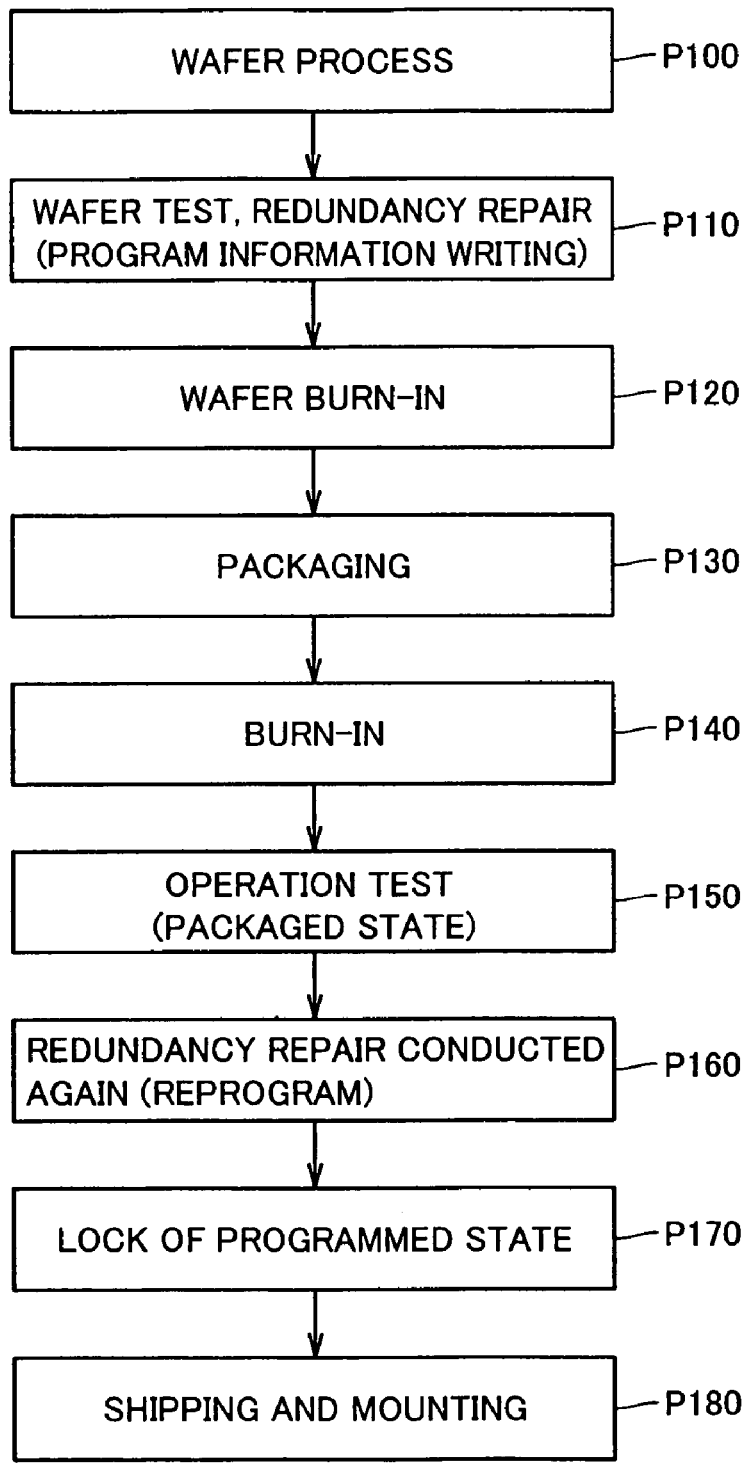
FIG. 15 is a flowchart illustrating a time period for application of a program input to the program circuit according to the second embodiment.

Referring to FIG. 15, the MRAM device having undergone the wafer process (process P100) including manufacturing steps of a circuit element group including MTJ memory cells, is subjected to a wafer test, and program information for use in redundancy repair of a defective memory cell detected in the wafer test is written into the program circuit (process P110). Programming in this step is carried out by laser irradiation.

The MRAM device is further subjected to a burn-in test in the wafer state (process P120) for accelerating manifestation of defects, and packaged (process P130) after completion of the wafer burn-in test.

The MRAM device packaged is again subjected to the burn-in test in the packaged state (process P140). The MRAM device having undergone the burn-in test after packaging is then subjected to a final operation test (process P150).

The defective memory cell finally detected in the process P150 is repaired by redundancy repair conducted again (process P160). That is, the redundancy repair in this stage can be done by reprogramming with breakdown of the program element. As a result, the state of the program element is fixed with the irreversible physical breaking (process P170) by laser irradiation (process P110) or a voltage stress input (process P160) for causing breakdown. The MRAM device is shipped and mounted (process P180) after the programmed state is locked. Thus, stability of the program information improves compared to the case where programming is done by magnetic data storage in an excessive MTJ memory cell.

As described above, according to the program circuit of the second embodiment, information programming is possible before and after the packaging step independently from each other, using the program element that can be manufactured without increasing the number of manufacturing steps. That is, while the program input for repairing a defective memory cell detected in the wafer state after completion of the wafer process is carried out by laser irradiation, a defect occurring after the relevant step can also be repaired with redundancy replacement by programming the defective address with a voltage stress input accompanied by breakdown. As a result, defects detected at the wafer test, test after burn-in and test after packaging can be programmed accumulatively for repair.

Third Embodiment

In the third embodiment, a configuration permitting program inputs in a plurality of steps using a program cell having the same structure as the MTJ memory cell, is described. The MRAM device of the third embodiment is identical to the MRAM device of the second embodiment except for the configurations of each program element and the program circuit. Thus, in the following, the program element and the program circuit of the third embodiment will be described in detail, and detailed description of the configurations and operations of the other portions will not be repeated.

Figure 16:
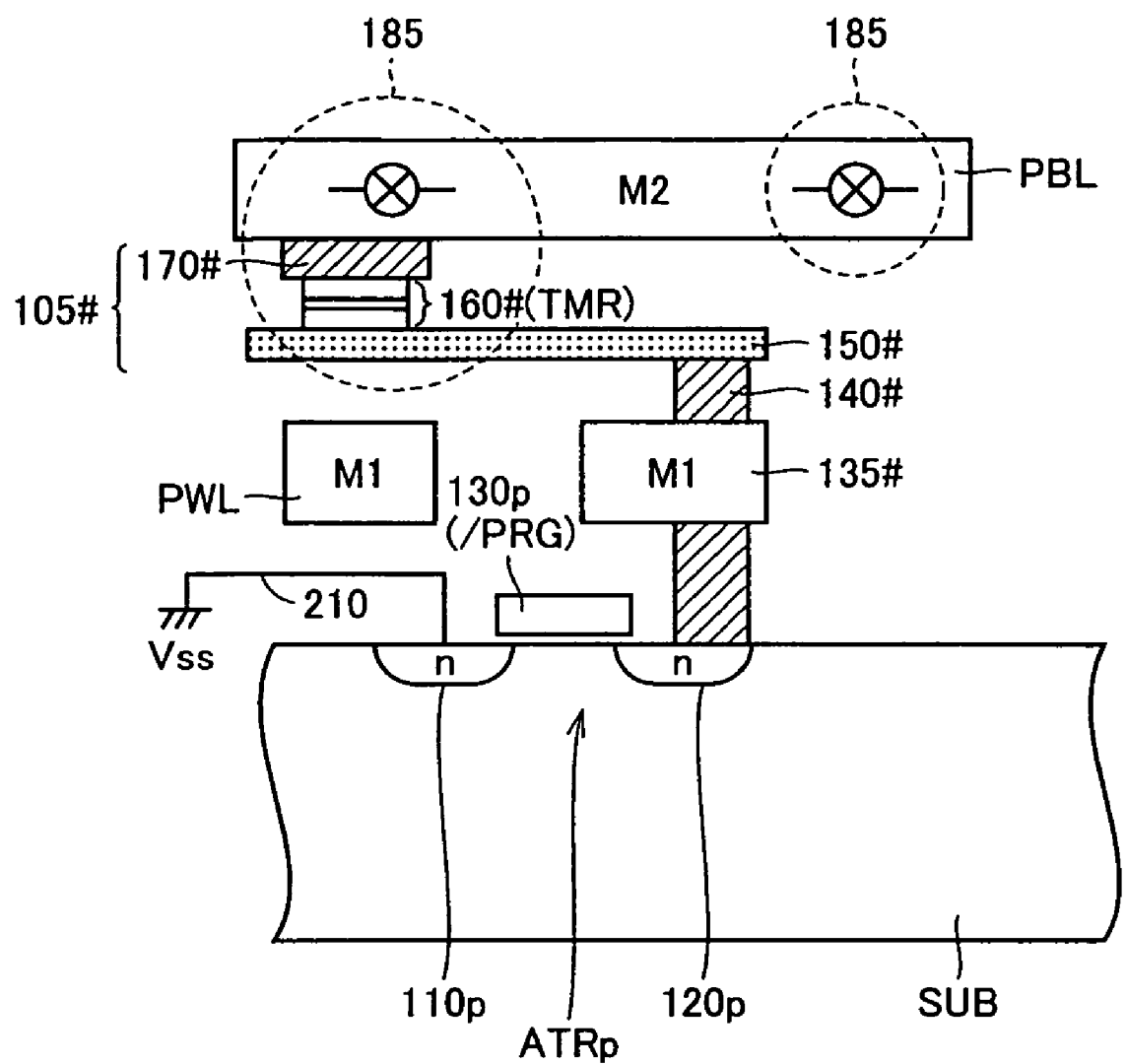
FIG. 16 shows by way of example a structure of the program element according to a third embodiment of the present invention.

Referring to FIG. 16, the program element according to the third embodiment has the same structure as the MTJ memory cell shown in FIG. 5. Thus, hereinafter, the program element of the third embodiment is also referred to as the program cell.

The program cell includes an access transistor ATRp formed in the same manner as access transistor ATR on a semiconductor substrate SUB, and a conductive magnetic film 105# including tunneling magneto-resistance element TMR.

Access transistor ATRp includes a source and a drain formed as impurity regions 110p, 120p on semiconductor substrate SUB. Impurity region 110p is connected to a ground node 210 (ground voltage Vss) and serves as the source. Impurity region 120 is electrically connected to conductive magnetic film 105# via a metal interconnection 135# provided in a metal interconnection layer M1 and a via contact 140# provided in a contact hole, and serves as the drain.

A program word line PWL and a program bit line PBL are arranged in metal interconnection layers M1 and M2, respectively, for carrying out magnetic data writing to a program cell in the same manner as with the MTJ memory cell. Program word line PWL and program bit line PBL correspond respectively to write word line WWL and bit line BL shown in FIG. 5.

A gate 130p receives a control signal /PRG that is set to an L level at the time of magnetic writing of program data using program word line PWL and program bit line PBL, and set to an H level at the time of reading of the program data.

Conductive magnetic film 105# has the same structure as conductive magnetic film 105 in the MTJ memory cell. Specifically, it has a lead interconnection 150#, a tunneling magnetic layer 106# and a via contact 170#, stacked one on another. Lead interconnection 150# is provided for electrically connecting tunneling magnetic layer 160# with via contact 140#. Via contact 170# electrically connects between tunneling magnetic layer 160# and program bit line PBL.

It is possible to perform, for the program cell of the third embodiment, both magnetic programming (data write) using program word line PWL and program bit line PBL, and programming with a blowing operation of a link portion 185 formed of at least a portion of program bit line PBL.

That is, program bit line PBL has at least a portion designed to have a shape and structure fusible with external laser irradiation. Link portion 185 may include a site other than program bit line PBL, e.g., conductive magnetic film 105#.

Now, the configuration for magnetic writing to the program cell is described with reference to FIGS. 17 and 18.

Figure 17:
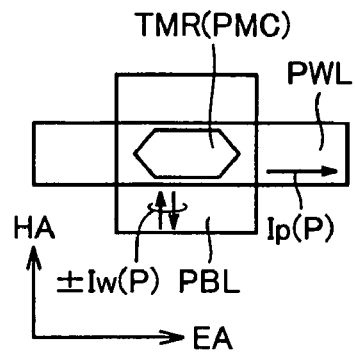
FIG. 17 is a conceptual diagram illustrating arrangement of a program word line and a program bit line with respect to the program cell according to the third embodiment.

FIG. 17 is a conceptual diagram showing arrangement of program word line PWL and program bit line PBL with respect to the program cell.

Referring to FIG. 17, each program cell PMC is provided corresponding to a crossing point of program word line PWL and program bit line PBL which are arranged along different directions. Currents (also referred to as the "program currents") for magnetically writing data to the program cell are passed through program word line PWL and program bit line PBL. Specifically, a program current Ip(P) for generating a magnetic field along the hard axis (HA) direction in tunneling magneto-resistance element TMR within the program cell is passed through program word line PWL. A program current ±Iw(P) for generating a magnetic field along the easy axis (EA) direction in the relevant tunneling magneto-resistance element TMR is passed through program bit line PBL.

Program word line PWL is arranged in the same direction with write word line WWL arranged in memory array 10, while program bit line PBL is arranged along the same direction with bit line BL arranged in memory array 10. This makes the program cells and the MTJ memory cells in the memory array arranged in the same directions, so that manufacturing and magnetizing steps thereof are simplified.

Figure 18:
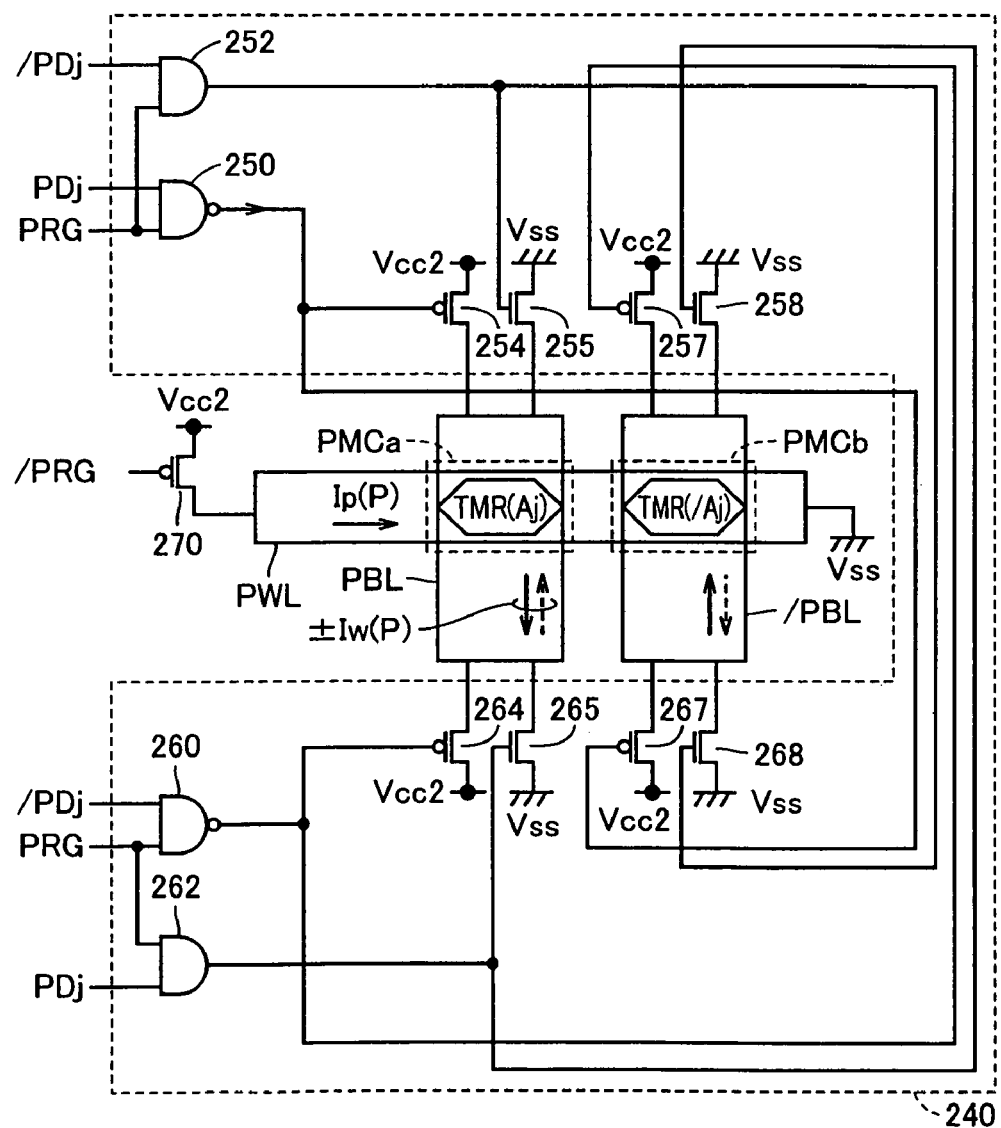
FIG. 18 is a circuit diagram showing a current supplying configuration at the time of data write to program cells.

FIG. 18 is a circuit diagram showing a current supplying configuration at the time of data write to program cells.

Referring to FIG. 18, program cells PMCa, PMCb included in the same program circuit have data of complementary levels written therein upon programming. One program word line PWL is arranged commonly for program cells PMCa, PMCb, and separate program bit lines PBL and /PBL are arranged corresponding to program cells PMCa and PMCb, respectively. Program word line PWL may further be shared by a plurality of program circuits.

A program current supply portion 240 includes control gates 250, 252, 260, 262 for controlling the directions of program currents ±Iw(P) supplied to program bit lines PBL, /PBL, voltage setting transistors 254, 255, 264, 265 provided corresponding to program bit line PBL, and voltage setting transistors 257, 258, 267, 268 provided corresponding to program bit line /PBL.

Control gate 250 outputs a NAND operation result between control signal PRG and program data PDj programmed in the j-th (j is an integer from 1 to h) program unit. Control gate 252 outputs an AND operation result between control signal PRG and inverted program data /PDj. Control gate 260 outputs a NAND operation result between control signal PRG and inverted program data /PDj. Control gate 262 outputs an AND operation result between control signal PRG and program data PDj.

Thus, when control signal PRG is at an L level, control gates 250, 260 being the NAND gates have their outputs each fixed to an H level, and control gates 252, 262 being the AND gates have their outputs each fixed to an L level. On the other hand, when control signal PRG is at an H level, control gates 250, 252, 260, 262 have their outputs each set to an H level or an L level in accordance with program data PDj.

Voltage setting transistor 254, formed of a P-MOS transistor, is electrically connected between one end of program bit line PBL and power supply voltage Vcc2. Voltage setting transistor 255, formed of an N-MOS transistor, is electrically connected between the one end of program bit line PBL and ground voltage Vss.

Voltage setting transistor 264, a P-MOS transistor, is electrically connected between the other end of program bit line PBL and power supply voltage Vcc2. Voltage setting transistor 265, an N-MOS transistor, is electrically connected between the other end of program bit line PBL and ground voltage Vss.

Voltage setting transistors 257 and 258 are provided at an end of program bit line /PBL in the same manner as voltage setting transistors 254 and 255. Voltage setting transistors 267 and 268 are provided at the other end of program bit line /PBL in the same manner as voltage setting transistors 264 and 265.

An output signal of control gate 250 is input to each gate of P-MOS transistors 254 and 267, and an output signal of control gate 252 is input to each gate of N-MOS transistors 255 and 268. An output signal of control gate 260 is input to each gate of P-MOS transistors 257 and 264, and an output signal of control gate 262 is input to each gate of N-MOS transistors 258 and 265.

At the time other than program data writing (control signal PRG=L level), each voltage setting transistor is turned off, and program bit lines PBL and /PBL are electrically disconnected from power supply voltage Vcc2 and ground voltage Vss.

At the time of program data writing (control signal PRG=H level), one voltage setting transistor is selectively turned on at each end of each program bit line in accordance with the level of program data PDj, such that currents in the opposite directions flow through program bit lines PBL and /PBL.

For example, when program data PDj is at an H level, voltage setting transistors 254 and 265 turn on and voltage setting transistors 255 and 264 turn off with respect to program bit line PBL. For program bit line /PBL, voltage setting transistors 267 and 258 turn on, while voltage setting transistors 257 and 268 turn off. Thus, program currents ±Iw(P) flow in the directions shown by solid line arrows in FIG. 18, acting on program cells PMCa and PMCb in the opposite directions.

When program data PDj is at an L level, on/off states of the respective voltage setting transistors are reversed. Thus, program currents ±Iw(P) flow through program bit lines PBL and /PBL in the directions shown by broken line arrows in FIG. 18, which are opposite to those when PDj=H level.

Program current ±Iw(P) generates a data write magnetic field along the easy axis for magnetization of program cells PMCa, PMCb in the direction in accordance with program data PDj. Since the program currents flow through program bit lines PBL and /PBL in the opposite directions irrelevant to the level of program data PDj, program cells PMCa and PMCb are magnetized along the easy axis in the opposite directions from each other at the time of program data writing.

Program current supply portion 240 further includes a select transistor 270 corresponding to program word line PWL. Select transistor 270 is electrically connected between power supply voltage Vcc2 and an end of program word line PWL, with its gate receiving an inverted signal /PRG of control signal PRG. The other end of program word line PWL is coupled to ground voltage Vss. Thus, at the time of program data writing, program current Ip(P) in a constant direction flows through program word line PWL. Program current Ip(P) applies a program magnetic field in the hard axis direction to each program cell PMC.

Program data PDj is magnetically written into a program cell PMC applied with the magnetic fields along both the easy axis and the hard axis, as with the MTJ memory cell in memory array 10.

Figure 19:
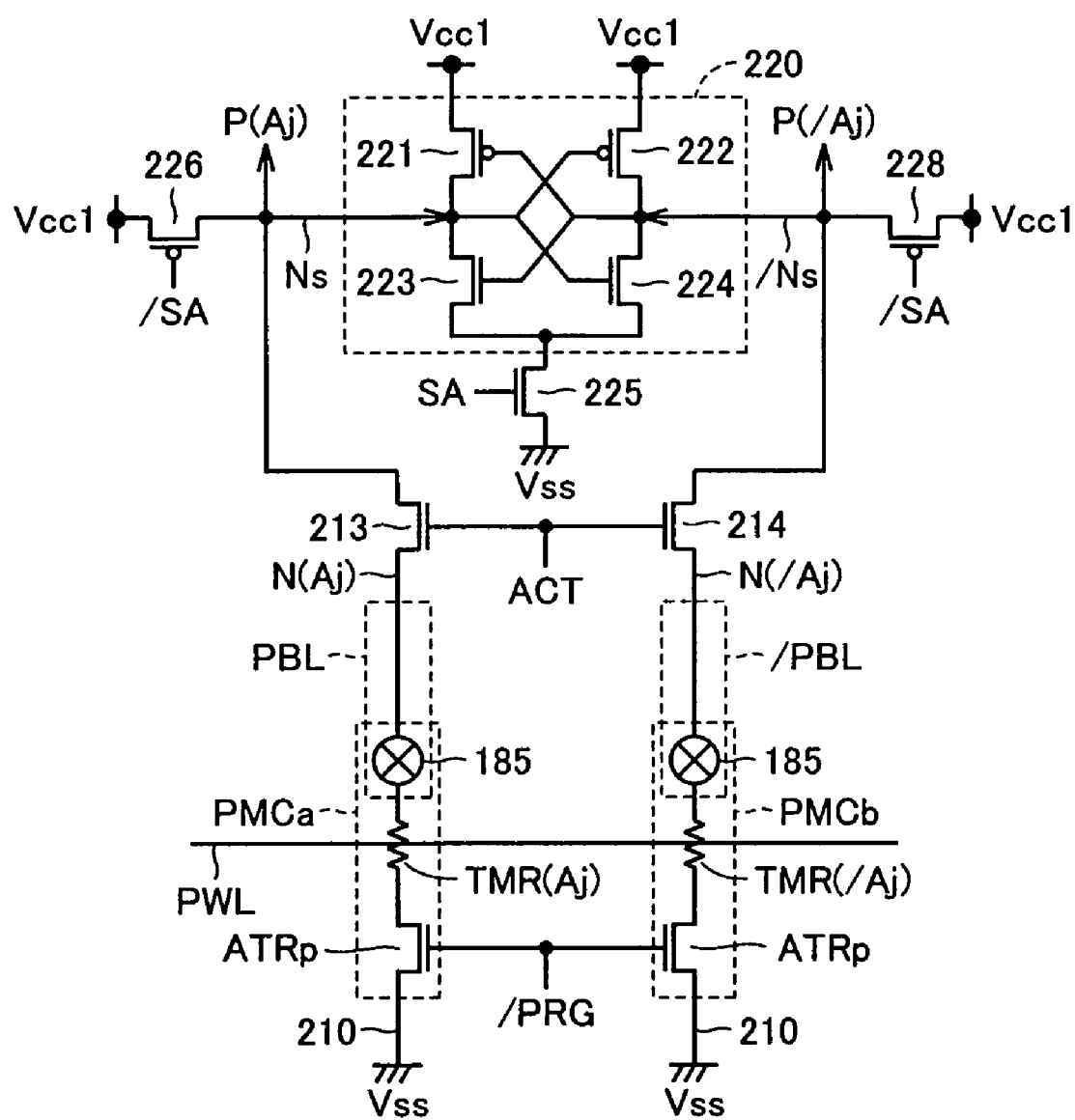
FIG. 19 is a circuit diagram showing a configuration of the program circuit according to the third embodiment.

Referring to FIG. 19, the program circuit according to the third embodiment differs from the program circuit of the second embodiment shown in FIG. 13 in that N-MOS transistors 211 and 212 for externally applying a voltage stress for breakdown are eliminated, and that program cells PMCa, PCMb are connected between nodes N(Aj), N(/Aj) and ground node 210, respectively, instead of program elements 180a, 180b.

Program cells PMCa and PMCb are electrically connected to nodes N(Aj) and N(/Aj) by program bit lines PBL and /PBL, respectively. Otherwise, the configuration of the program circuit of the third embodiment is identical to that of the program circuit shown in FIG. 13, so that the same reference characters are employed and description thereof is not repeated.

With such a configuration, prior to a blow input to a link portion 185 including at least a portion of program bit line PBL, /PBL, data of complementary levels can be magnetically written into program cells PMCa and PMCb to store program information of one bit in accordance with a resistance difference generated between nodes N(Aj), N(/Aj) and ground node 210.

Further, after the magnetic programming, link portion 185 can be blown with external laser irradiation, so that the resistance difference between program cells PMCa and PMCb can be fixed stably. The resistance difference that occurs due to such programming with blowing is relatively large compared to the resistance difference caused by magnetic programming. Thus, it is possible to rewrite the magnetically written program information with the laser blow programming.

As described above, according to the configuration of the third embodiment, information programming is possible before and after the laser blow independently from each other, using the program element which can be manufactured without increasing the number of manufacturing steps. As such, after information for repairing a defective memory cell detected in the wafer-state operation test (process P110 in FIG. 15) is programmed by magnetic writing, a test as to whether desired redundancy repair is performed can be carried out without actual laser blow. Further, the confirmed program information can be stored stably with the laser blow.

In the program circuit shown in FIG. 19, as in the second embodiment, one of program cells PMCa, PMCb may be formed with a reference resistance, in which case, the program signal can be generated in accordance with comparison of the resistance between node N(Aj) or N(/Aj) and ground node 210 with the reference resistance.

In the first through third embodiments, the case where a column address corresponding to a defective cell is programmed as a defective address and redundancy repair is carried out in a unit of memory cell column has been described. The present invention, however, may also be applicable to the case where redundancy repair is conducted in a unit of memory cell row or data I/O line. In such a case, an address indicating a memory cell row or a data I/O line corresponding to the defective cell may be stored using the program element or the program circuit according to the embodiment of the present invention.

Further, in the first through third embodiments, the case where the defective address for use in redundancy repair of a defective memory cell is stored by the program element and the program circuit of the present invention has been described. The present invention, however, is not limited thereto. The program element and the program circuit according to the present invention are also applicable to the case of programming any other information for tuning internal voltages, element resistance values and others.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
a plurality of magnetic memory cells permitting random accesses; and
a program circuit storing information in a fixed manner; wherein
each of said plurality of magnetic memory cells includes a tunneling magneto-resistance element formed of a plurality of layers including a conductive magnetic film and an insulating film and having a resistance changed in accordance with magnetically written data,
said program circuit includes
a first program element connected between first and second nodes, and formed of said plurality of layers as with said tunneling magneto-resistance element,
an amplifier portion reading said information in accordance with a resistance between said first and second nodes, and
a first breakdown voltage apply portion applying a first voltage stress capable of causing breakdown of said insulating film in said plurality of layers constituting said first program element, between said first and second nodes as appropriate,
an upper layer side and a lower layer side of said plurality of layers constituting said first program element are electrically connected to one and the other of said first and second nodes, and
said first program element is shaped such that at least a portion of its portion electrically connected between said first and second nodes is fusible with a first external input, wherein
said first external input is applied before a packaging step of said thin film magnetic memory device, and
said first voltage stress for breaking said insulating film is applied after said packaging step of said thin film magnetic memory device.

2. A thin film magnetic memory device comprising:
a plurality of magnetic memory cells permitting random accesses; and a program circuit storing information in a fixed manner; wherein each of said plurality of magnetic memory cells includes a tunneling magneto-resistance element formed of a plurality of layers including a conductive magnetic film and an insulating film and having a resistance changed in accordance with magnetically written data.

said program circuit includes a first program element connected between first and second nodes, and formed of said plurality of layers as with said tunneling magneto-resistance element, an amplifier portion reading said information in accordance with a resistance between said first and second nodes, and a first breakdown voltage apply portion applying a first voltage stress capable of causing breakdown of said insulating film in said plurality of layers constituting said first program element, between said first and second nodes as appropriate, an upper layer side and a lower layer side of said plurality of layers constituting said first program element are electrically connected to one and the other of said first and second nodes, and said first program element is shaped such that at least a portion of its portion electrically connected between said first and second nodes is fusible with a first external input, wherein said first external input is laser irradiation applicable before a packaging step of said thin film magnetic memory device, and said first voltage stress is applied after said packaging step of said thin film magnetic memory device.

3. A thin film magnetic memory device comprising:

a plurality of magnetic memory cells permitting random accesses; and a program circuit storing information in a fixed manner; wherein each of said plurality of magnetic memory cells includes a tunneling magneto-resistance element formed of a plurality of layers including a conductive magnetic film and an insulating film and having a resistance changed in accordance with magnetically written data, said program circuit includes a first program element connected between first and second nodes, and formed of said plurality of layers as with said tunneling magneto-resistance element, an amplifier portion reading said information in accordance with a resistance between said first and second nodes, and a first breakdown voltage apply portion applying a first voltage stress capable of causing breakdown of said insulating film in said plurality of layers constituting said first program element, between said first and second nodes as appropriate, an upper layer side and a lower layer side of said plurality of layers constituting said first program element are electrically connected to one and the other of said first and second nodes, and said first program element is shaped such that at least a portion of its portion electrically connected between said first and second nodes is fusible with a first external input, wherein said program circuit further includes a second program element connected between a third node and said second node and formed of said plurality of layers as with said tunneling magneto-resistance element, and a second breakdown voltage apply portion applying a second voltage stress capable of causing breakdown of said insulating film in said plurality of layers constituting said second program element, between said second and third nodes as appropriate, an upper layer side and a lower layer side of said plurality of layers constituting said second program element are electrically connected to one and the other of said second and third nodes, said second program element is shaped such that at least a portion of its portion electrically connected between said second and third nodes is fusible with a second external input, and said amplifier portion reads said information in accordance with comparison of the resistance between said first and second nodes with a resistance between said second and third nodes.

4. The thin film magnetic memory device according to claim 3, wherein each of said first and second external inputs is laser irradiation applicable before a packaging step of said thin film magnetic memory device, and each of said first and second voltage stresses for breaking said insulating film is applied after said packaging step of said thin film magnetic memory device.

* * * * *